United States Patent
Hamada et al.

(10) Patent No.: US 10,356,892 B2
(45) Date of Patent: Jul. 16, 2019

(54) IMAGE PICKUP APPARATUS THAT IS IMPROVED IN HEAT DISSIPATION EFFICIENCY, ELECTRONIC APPARATUS, AND ACCESSORY

(71) Applicant: CANON KABUSHIKI KAISHA, Tokyo (JP)

(72) Inventors: Takeshi Hamada, Kawasaki (JP); Yoko Shimizu, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/895,083

(22) Filed: Feb. 13, 2018

(65) Prior Publication Data

US 2018/0263104 A1 Sep. 13, 2018

(30) Foreign Application Priority Data

Mar. 7, 2017 (JP) ................................ 2017-042948
Aug. 31, 2017 (JP) ................................ 2017-167365

(51) Int. Cl.
*H05K 1/02* (2006.01)
*H04N 5/225* (2006.01)

(52) U.S. Cl.
CPC .......... *H05K 1/021* (2013.01); *H04N 5/2253* (2013.01); *H04N 5/22521* (2018.08); *H05K 1/0209* (2013.01); *H04N 5/2252* (2013.01)

(58) Field of Classification Search
USPC ....................................... 361/679.47, 679.49
See application file for complete search history.

(56) References Cited

U.S. PATENT DOCUMENTS

| | | | | |
|---|---|---|---|---|
| 6,935,419 | B2* | 8/2005 | Malone | F28F 3/02 165/146 |
| 8,004,837 | B2* | 8/2011 | Soma | H05K 7/1417 361/695 |
| 8,081,465 | B2* | 12/2011 | Nishiura | H01L 23/3735 165/147 |

(Continued)

FOREIGN PATENT DOCUMENTS

| JP | 2014044293 A | 3/2014 |
|---|---|---|
| JP | 2014045345 A | 3/2014 |

(Continued)

OTHER PUBLICATIONS

Office Action issued in Japanese Appln. No. 2017-167365 dated Jan. 8, 2019.

*Primary Examiner* — Mukundbhai G Patel
(74) *Attorney, Agent, or Firm* — Rossi, Kimms & McDowell LLP

(57) ABSTRACT

An image pickup apparatus improved in heat dissipation efficiency. An image pickup section includes an image pickup device. A circuit board includes an image processor for processing on output from the image pickup device. A duct section has a fan for discharging heat generated on the circuit board to the outside. A rear cover forming a part of an exterior is disposed at the rear of the apparatus in an optical axis direction. The circuit board is disposed between the duct section and the rear cover in the optical axis direction. The duct section includes a plurality of extended portions which are extended in the optical axis direction to surround the circuit board and are in contact with the rear cover.

28 Claims, 18 Drawing Sheets

(56) References Cited

U.S. PATENT DOCUMENTS

| | | | |
|---|---|---|---|
| 8,335,081 B2* | 12/2012 | Weiss | H05K 7/20163 |
| | | | 361/694 |
| 2005/0286231 A1* | 12/2005 | Kishi | H01L 23/3672 |
| | | | 361/709 |
| 2014/0055671 A1* | 2/2014 | Kawamura | H04N 5/2252 |
| | | | 348/374 |

FOREIGN PATENT DOCUMENTS

| | | | |
|---|---|---|---|
| JP | 2014204606 A | 10/2014 | |
| JP | 2016122718 A | 7/2016 | |

* cited by examiner

IMAGE PICKUP APPARATUS THAT IS IMPROVED IN HEAT DISSIPATION EFFICIENCY, ELECTRONIC APPARATUS, AND ACCESSORY

BACKGROUND OF THE INVENTION

Field of the Invention

The present invention relates to an image pickup apparatus, an electronic apparatus, and an accessory.

Description of the Related Art

In recent years, in response to demands for reducing the size of an electronic apparatus, components mounted inside the electronic apparatus have been remarkably reduced in size, and increased in density. On the other hand, a demand for realizing more advanced and higher-performance electronic apparatuses has become strong, and apparatuses tend to generate an increased amount of heat. A high-temperature environment under which an electronic apparatus operates can be a cause of an erroneous operation or lowered performance of components mounted in the apparatus, which in turn causes a failure of the apparatus. Therefore, the recent electronic apparatuses are required to have high heat dissipation performance.

To meet this requirement, in a case where an apparatus does not dissipate a sufficient amount of heat by natural heat dissipation, compared with the amount of heat generated by the apparatus, there is used a heat dissipation structure in which a fan is used for forced air cooling. For example, as the structure for collectively cooling components mounted on a circuit board in a widely distributed manner, structures are known in which a circuit board and components mounted as heat sources on the circuit board are connected to a duct, and air drawn by a fan is ventilated through the duct (see e.g. Japanese Laid-Open Patent Publication (Kokai) No. 2016-122718 and Japanese Laid-Open Patent Publication (Kokai) No. 2014-44293). In these structures, the heat dissipation performance is improved by providing a plurality of fins in the duct to increase a heat dissipation area.

The duct disclosed in Japanese Laid-Open Patent Publication (Kokai) No. 2016-122718 is connected, via a thermally conductive member, to a circuit board as an object from which heat is to be dissipated, and a plurality of fans are arranged in parallel at respective locations which are not on a plane of shadow projection of the circuit board. This makes it possible to obtain high heat dissipation performance in a wide range on the circuit board as the object from which heat is to be dissipated. The duct is provided with intake ports for sucking air from the outside and openings for guiding intake air sucked from the intake ports to the plurality of fans, and further, air flow passages branched to be connected to the plurality of fans, respectively, are linearly provided therein. Further, a plurality of fins each having a linear shape are provided in each air flow passage, in parallel to a main flow direction of the air flow passage, to prevent increase in ventilation resistance. On the other hand, the duct disclosed in Japanese Laid-Open Patent Publication (Kokai) No. 2014-44293 is fixed to a circuit board as an object from which heat is to be dissipated, and the fan is arranged on a plane of shadow projection of the circuit board, whereby the duct is prevented from being increased in the size on plane parallel to the circuit board. Further, an image pickup section and the fan are disposed on a plane orthogonal to an optical axis, and the image pickup section, the fan, the duct, and the circuit board are arranged along a direction parallel to the optical axis, whereby heat generated from the circuit board is made difficult to be transferred to the image pickup section.

However, although in the structure disclosed in Japanese Laid-Open Patent Publication (Kokai) No. 2016-122718, heat dissipation is realized by the forced air cooling mechanism using the duct and the fans, it is impossible to obtain a heat dissipation effect enough to overcome the recent tendency of increase in the amount of heat generated in a circuit board. Further, conventional electronic apparatuses, such as a digital video camera, often use exterior components formed of resin. Heat dissipated by the forced air cooling mechanism is difficult to be transferred to the exterior components made of resin, and hence only heat discharge mainly using the intake and exhaust ports is taken into consideration. Further, the fans are arranged at the locations distant from the plane of shadow projection of the circuit board as the object from which heat is to be dissipated, and further, the plurality of fans are used for the plurality of air flow passages, and hence the size of the apparatus is increased.

The duct disclosed in Japanese Laid-Open Patent Publication (Kokai) No. 2014-44293 is fixed to the circuit board as the object from which heat is to be dissipated, and hence it is necessary to separately use a plate metal or the like to fix the circuit board to the electronic apparatus body. In general, the duct formed of e.g. aluminum die cast is high in rigidity, whereas the circuit board is low in rigidity, and further, the circuit board is generally fixed at the periphery (edge portions) thereof so as to prevent the circuit board from interfering with the arrangement of the duct and the fan. For this reason, if a compression force or a torsional force is applied from the outside to the electronic apparatus, the rigidity against the force is not sufficient. Particularly, since the image pickup section and the forced air cooling mechanism are arranged along the optical axis direction, the rigidity against a force applied from the outside in the optical axis direction is not sufficient. In this case, to increase the rigidity, addition of a new member is required, which increases the number of components and manufacturing costs. Further, in the structure disclosed in Japanese Laid-Open Patent Publication (Kokai) No. 2014-44293, to suppress increase in ventilation resistance caused by fins in the vicinity of an intake port of the fan, no fins are disposed immediately under the intake port of the fan. As a result, the heat dissipation performance immediately under the intake port of the fan is lower than that at other portions on the circuit board as the object from which heat is to be dissipated, which can cause a locally increased temperature.

Incidentally, the amount of power consumption and the amount of heat generation are different between the mounted components as the heat sources, and generally, there is a large distribution of the amount of heat generation on the circuit board. However, in the structures disclosed in Japanese Laid-Open Patent Publication (Kokai) No. 2016-122718 and Japanese Laid-Open Patent Publication (Kokai) No. 2014-44293, if there is a mounted component which locally generates a large amount of heat, there is a fear that the temperature of the component may become abnormally high. Therefore, if there is a heat generation amount distribution on a circuit board, it is difficult to make uniform the temperatures of the circuit board and the components mounted thereon while avoiding increase in the size of the apparatus. Further, in both of Japanese Laid-Open Patent Publication (Kokai) No. 2016-122718 and Japanese Laid-Open Patent Publication (Kokai) No. 2014-44293, the usage of the apparatus under an outdoor environment in a stormy weather condition is not considered. If the electronic apparatus is covered with a rain cover as a simple measure against rainy weather or stormy weather, there is a fear that a vent hole is blocked. If the vent hole is blocked, the ventilation performance is lowered, and part of heat to be discharged is transferred around to the intake air, which makes it impossible to maintain a sufficient heat dissipation function.

SUMMARY OF THE INVENTION

The present invention provides an image pickup apparatus, an electronic apparatus, and an accessory, which are improved in heat dissipation efficiency.

In a first aspect of the present invention, there is provided an image pickup apparatus comprising an image pickup section including an image pickup device, a circuit board configured to perform image processing on output from the image pickup device, a duct section configured to discharge heat generated on the circuit board to outside, and a rear member that is disposed at a rear part of the image pickup apparatus in an optical axis direction, and forms a part of an exterior, wherein the circuit board is disposed between the duct section and the rear member in the optical axis direction, and wherein the duct section includes a plurality of extended portions that are extended in the optical axis direction and are in contact with the rear member.

In a second aspect of the present invention, there is provided an electronic apparatus comprising a fan that has an intake port, a duct section that has an opening corresponding to the intake port of the fan, a circuit board that is connected to the duct section, and is disposed to be laminated on the duct section on an opposite side from the fan, a first cover that is disposed on an opposite side from the fan with respect to the circuit board, and forms a part of an exterior, and a second cover that forms a part of the exterior in a direction substantially orthogonal to a laminating direction in which the duct section and the circuit board are laminated, wherein the duct section includes a plurality of first extended portions extended to surround the circuit board, and a plurality of second extended portions extended in the direction substantially orthogonal to the laminating direction, and wherein the first extended portions are fixed to the first cover, and the second extended portions are fixed to the second cover.

In a third aspect of the present invention, there is provided an image pickup apparatus including an electronic apparatus, the electronic apparatus comprising a fan that has an intake port, a duct section that has an opening corresponding to the intake port of the fan, a circuit board that is connected to the duct section, and is disposed to be laminated on the duct section on an opposite side from the fan, a first cover that is disposed on an opposite side from the fan with respect to the circuit board, and forms a part of an exterior, and a second cover that forms a part of the exterior in a direction substantially orthogonal to a laminating direction in which the duct section and the circuit board are laminated, wherein the duct section includes a plurality of first extended portions extended to surround the circuit board, and a plurality of second extended portions extended in the direction substantially orthogonal to the laminating direction, and wherein the first extended portions are fixed to the first cover, and the second extended portions are fixed to the second cover.

In a fourth aspect of the present invention, there is provided an accessory that can be attached to an electronic apparatus including a fan, vent holes, and an attachment portion, wherein the accessory is attached to the attachment portion, comprising a base portion that is opposed to the vent holes in an attached state of the accessory in which the accessory is attached to the attachment portion, extended portions that are extended from the base portion and are in abutment with the electronic apparatus in the attached state of the accessory to form an opening for communicating the vent holes to outside air between the electronic apparatus and the base portion, and a regulating portion that regulates a position of an end portion of a cover placed on the electronic apparatus to thereby prevent the opening from being blocked by the cover.

According to the present invention, it is possible to improve the heat dissipation efficiency of the electronic apparatus, electronic apparatus, and accessory, without increasing the size of the apparatus.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1A:
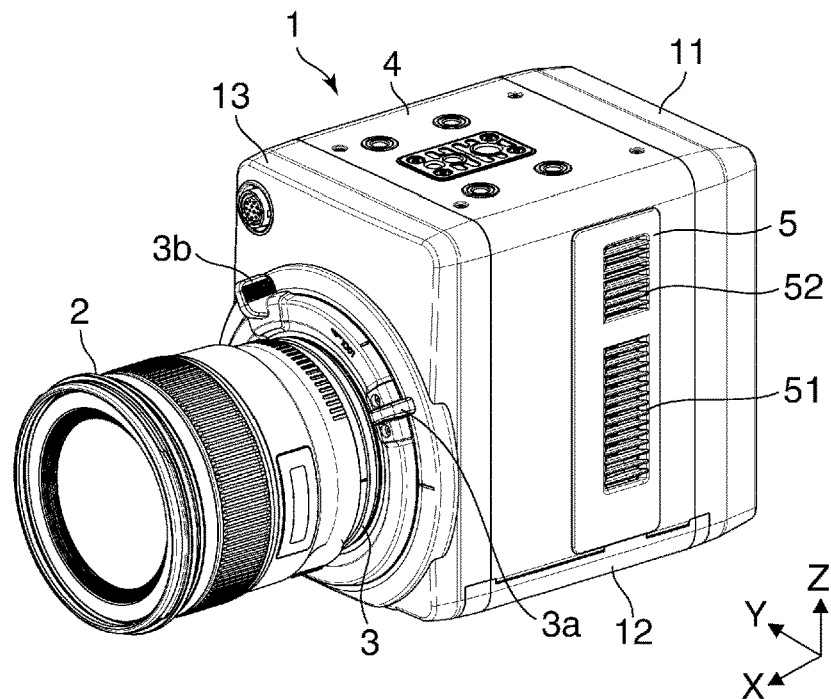
FIG. 1A is a perspective view of an image pickup apparatus system including an image pickup apparatus as an electronic apparatus according to a first embodiment of the present invention, which has a heat dissipation structure, as viewed from the front.
Figure 1B:
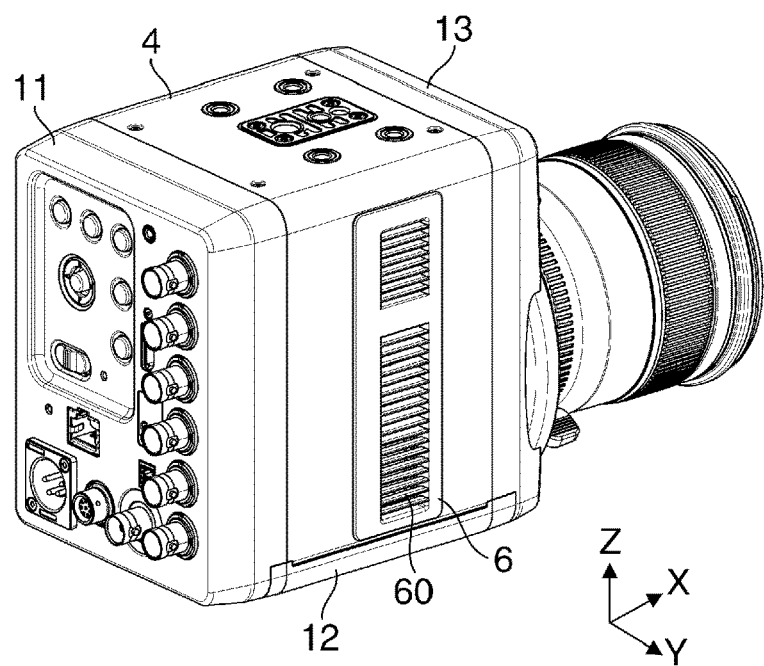
FIG. 1B is a perspective view of the image pickup apparatus system, shown in FIG. 1A, as viewed from the rear.

FIGS. 1A and 1B are perspective views of an electronic apparatus according to a first embodiment of the present invention, which has a heat dissipation structure. Although an image pickup apparatus is given as an example of the electronic apparatus, the type of the electronic apparatus to which the present embodiment is applied is not particularly limited. FIGS. 1A and 1B show perspective views of an image pickup apparatus system in which an interchangeable lens 2 is removably mounted on the image pickup apparatus, denoted by reference numeral 1, as viewed from the front and the rear, respectively.

Note that in the following description, a side of the image pickup apparatus 1, on which the interchangeable lens 2 is mounted (an object side), is referred to as the front side. Three-dimensional coordinates are set as shown in FIGS. 1A and 1B. Here, x-axis, y-axis, and z-axis directions in FIGS. 1A and 1B correspond to front-rear, left-right, and top-bottom directions, respectively. Note that the left-right direction is referred to a direction as viewed from the front. More specifically, a direction from the image pickup apparatus 1 toward an object in an optical axis direction of the interchangeable lens 2 is defined as the positive x-axis direction, a direction toward the left as viewed from the front is defined as the positive y-axis direction, an upward vertical direction orthogonal to the x-axis direction and the y-axis direction is defined as the positive z-axis direction. Therefore, the positive z-axis direction is referred to as upward, the negative z-axis direction is referred to as downward, the positive y-axis direction is referred to as leftward, the negative y-axis direction is referred to as rightward, the positive x-axis direction is referred to as frontward, and the negative x-axis direction is referred to as rearward.

The interchangeable lens 2 is mounted on the front side of the image pickup apparatus 1, and is attached to a lens mount 3 provided on the image pickup apparatus 1. The lens mount 3 adopts a method in which a screw portion having knobs 3a and 3b is rotated about the optical axis in an anticlockwise direction, as viewed from the front, and a pawl portion (not shown) provided on the interchangeable lens 2 is retracted rearward. However, this is not limitative, but for example, there may be adopted a known bayonet method in which the interchangeable lens 2 is rotated about the optical axis so as to be fixed to the image pickup apparatus 1, or any other suitable method. The exterior of the image pickup apparatus 1 is mainly formed by a front cover 13, a rear cover 11, a bottom cover 12, and a top cover 4. An intake-side duct cover 5 (see FIG. 1A) and an exhaust-side duct cover 6 (see FIG. 1B) are attached to the right side and the left side of the top cover 4, respectively. Heat inside the image pickup apparatus 1 is dissipated by forced air cooling using air sucked from the outside by a fan 130 (described hereinafter with reference to FIG. 4). The intake-side duct cover 5 is formed with a first outside air intake port 51 and a second outside air intake port 52 for introducing outside air, and the exhaust-side duct cover 6 is formed with an outside exhaust port 60 for discharging the introduced air to the outside of the image pickup apparatus 1. A top cover unit is formed by the top cover 4, the intake-side duct cover 5, and the exhaust-side duct cover 6.

Figure 2:
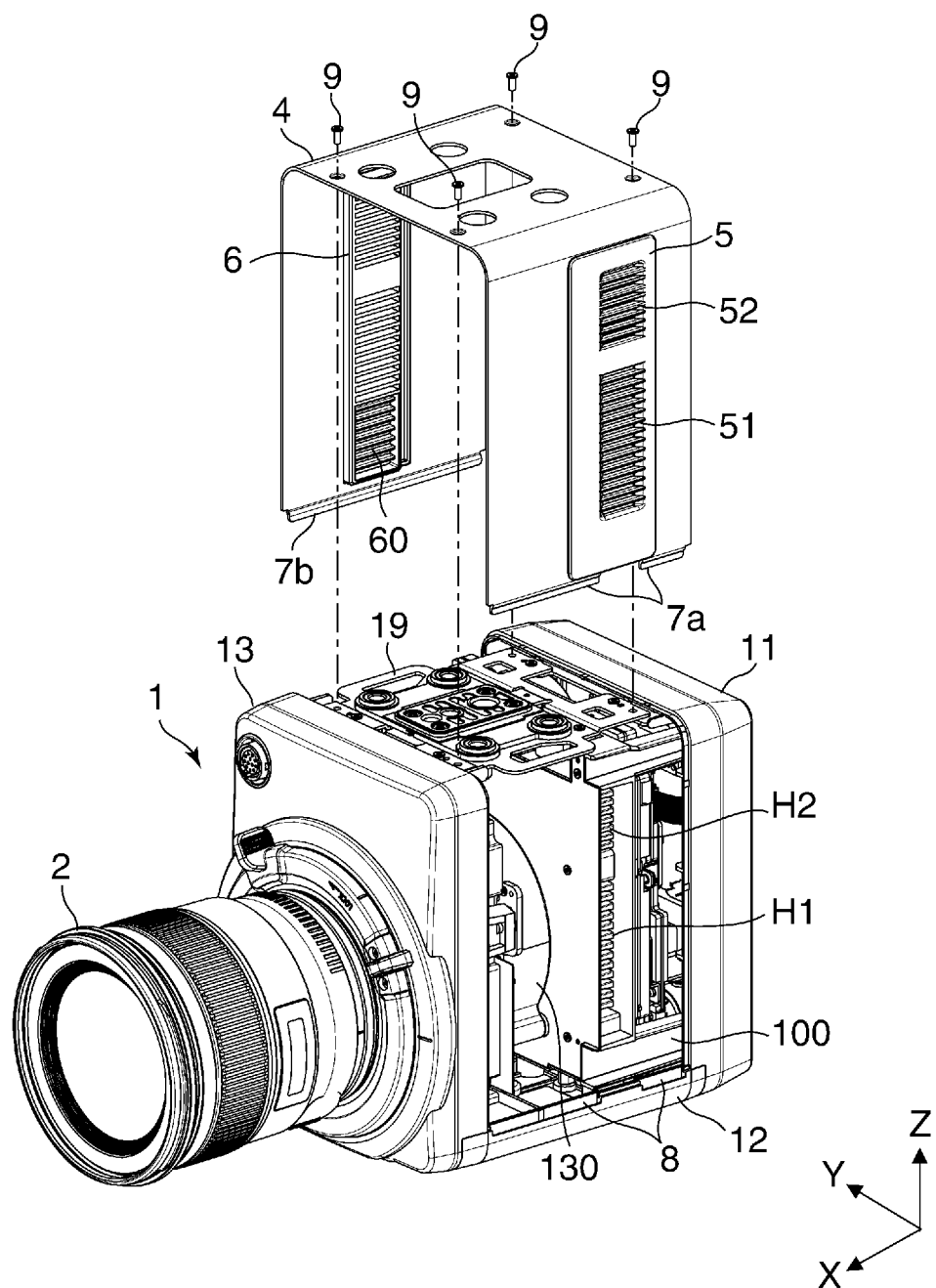
FIG. 2 is an exploded perspective view of the image pickup apparatus system.

FIG. 2 is an exploded perspective view of the image pickup apparatus system in a state in which the top cover unit is removed. The top cover 4 has a substantially U-shape, and includes lugs 7a and a lug 7b for insertion, which are provided at the right end bottom and the left end bottom thereof, respectively. The bottom cover 12 is formed with insertion grooves 8 (one on the left side is not shown), in which the lugs 7a and 7b are fitted, in the right end bottom and the left end bottom thereof, respectively.

The top cover unit is assembled to the image pickup apparatus 1 in the following manner: An operator slides the top cover unit in the negative z-axis direction along ribs which are formed on outer peripheries of the front cover 13 and the rear cover 11 in a manner extending in the negative and positive x-axis directions. Then, the operator inserts the lugs 7a and 7b of the top cover 4 in the insertion grooves 8 (one on the left side is not shown) of the bottom cover 12, and fixes the top cover unit to the image pickup apparatus 1 with screws 9.

Figure 3:
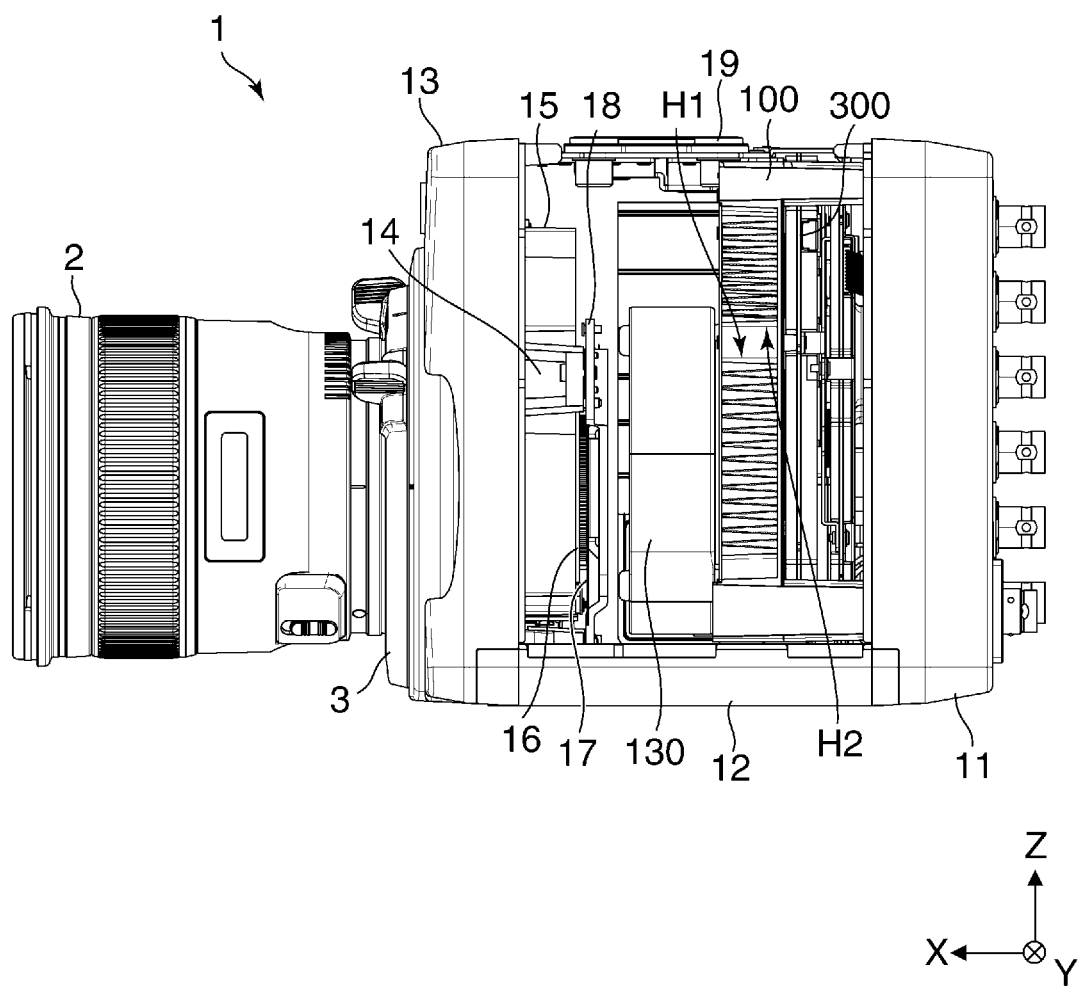
FIG. 3 is a side view of the image pickup apparatus system on an x-z plane.

FIG. 3 is a side view of the image pickup apparatus system, on an x-z plane, in the state in which the top cover unit is removed. A front base 14 is mounted on the lens mount 3. An ND unit 15 is disposed between the lens mount 3 and an image pickup device 16. Light incident through the interchangeable lens 2 passes the ND unit 15, and then forms an image on the image pickup device 16 on a sensor circuit board 17.

The image pickup device 16 mounted on the sensor circuit board 17 is fixed to a sensor plate 18 by UV adhesion. The fan 130 is mounted on a duct base 100 which is fixed to the rear cover 11. Further, a main circuit board 300 is connected to the duct base 100. A surface of the main circuit board 300, on which components are mounted, a surface of the duct base 100, on which the main circuit board 300 is mounted, and an intake surface of the fan 130 (a flat surface including a rear edge of a circular intake port 131: see FIGS. 4 and 12) are all parallel to a y-z plane. The fan 130 is disposed such that the intake surface thereof overlaps the main circuit board 300, as viewed in the x-axis direction. This prevents the image pickup apparatus 1 from being increased in size in the y-z plane.

Figure 4:
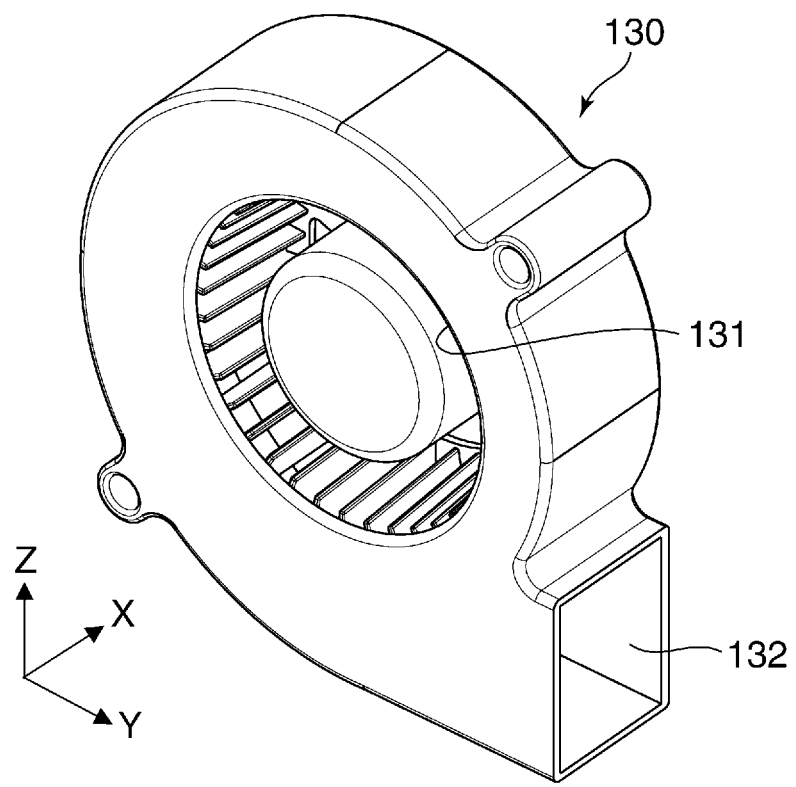
FIG. 4 is a perspective view of a fan.

FIG. 4 is a perspective view of the fan 130, as viewed obliquely from the rear. The fan 130 is a centrifugal fan, and has a feature that the fan 130 makes it easy to obtain a large amount of air flow even in an air flow passage having a large ventilation resistance. The intake port 131 opens in a rear surface of the fan 130, such that it forms a substantially circular shape, and an exhaust port 132 opens in a side surface of the fan 130. Inside the fan 130, there are arranged a plurality of blades which are rotated to thereby suck air from the intake port 131 and discharge air from the exhaust port 132, and a motor for rotating these blades. The fan 130 discharges air, which is sucked from the intake port 131, in a direction from the negative x-axis direction toward the positive x-axis direction, from the exhaust port 132 in the positive y-axis direction. Note that the fan 130 is not limited to the centrifugal fan, but there may be used e.g. an axial fan.

As shown in FIG. 3, the duct base 100 is formed with a first duct opening H1 and a second duct opening H2. The first duct opening H1 and the second duct opening H2 are formed at locations corresponding, in a state in which the top cover unit is fitted, to the first outside air intake port 51 and the second outside air intake port 52 of the intake-side duct cover 5, respectively. Therefore, by driving the fan 130, it is possible to introduce outside air into the image pickup apparatus 1 through the duct openings H1 and H2. On the other hand, as for the exhaust side, the fan 130 is arranged such that the exhaust port 132 corresponds to the outside exhaust port 60 (see FIG. 2) formed in the exhaust-side duct cover 6. Air sucked by the fan 130 is used to cool the inside of the image pickup apparatus 1, and is then discharged out of the image pickup apparatus 1.

The sensor circuit board 17 appearing in FIG. 3 converts light received by the image pickup device 16 to electric signals. The main circuit board 300 is electrically connected to the sensor circuit board 17, and performs image processing, video outputting, and so on. A lot of electric components, which are heat sources, are mounted on both of the circuit boards. Heat generated on the sensor circuit board 17 is diffused to the sensor plate 18 mainly by heat conduction, then transferred to air inside the image pickup apparatus 1, and finally dissipated to outside air by natural heat dissipation through the exterior of the image pickup apparatus 1. The sensor plate 18 is formed of a high thermal conductivity material, such as an aluminum alloy, and effectively diffuses and dissipates heat generated on the sensor circuit board 17.

Figure 5:
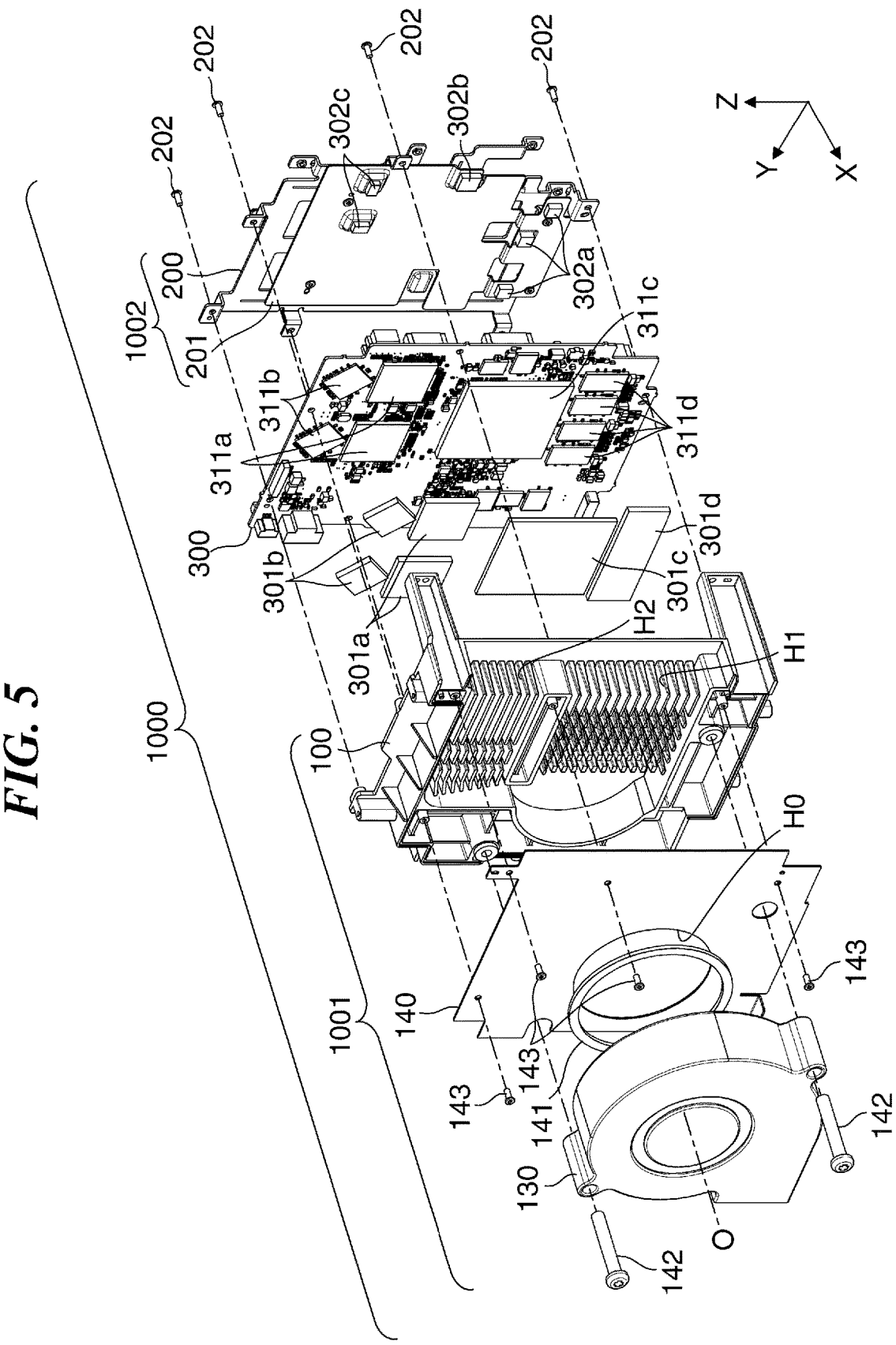
FIG. 5 is an exploded perspective view of a heat dissipation unit.

Heat generated on the main circuit board 300 is subjected to forced air cooling mainly by a heat dissipation unit 1000, shown in FIG. 5. The structure of the heat dissipation unit 1000 will be described with reference to FIGS. 5 and 6.

FIG. 5 is an exploded perspective view of the heat dissipation unit 1000. The heat dissipation unit 1000 includes a first unit 1001, a second unit 1002, the main circuit board 300 as the main heat source, members 301a, 301b, 301c, 301d, 302a, 302b, and 302c, which are made of a thermal conductivity material, and screws 202. The second unit 1002 is formed by fixing a heat diffusion plate 201 to a main circuit board holder 200 with screws. The main circuit board 300 is sandwiched between the first unit 1001 and the second unit 1002, in the front-rear direction, and is fixed with the screws 202.

The main circuit board 300 has components 311a, 311b, 311c, and 311d, which are electronic components, mounted on the front surface (surface facing in the positive x-axis direction) thereof, and also has electronic components, not shown, mounted on the rear surface (surface facing in the negative x-axis direction) thereof. Here, in a state in which the first unit 1001 is assembled, the members 301a, 301b, 301c, and 301d corresponding in shape to the mounted components 311a, 311b, 311c, and 311d, respectively, are held in a compressed state between the main circuit board 300 and the first unit 1001. Further, the members 302a, 302b, and 302c corresponding in shape to the electronic components, not shown, mounted on the rear surface of the main circuit board 300, respectively, are held in a compressed state between the main circuit board 300 and the second unit 1002. With this, it is guaranteed that the first unit 1001 and the second unit 1002 are each thermally (thermally conductively) connected to the main circuit board 300.

In the first unit 1001, a duct cover 140 and the fan 130 are fixed to the duct base 100 with screws 143 and 142. A duct section is formed by the duct base 100 and the duct cover 140. The duct cover 140 is formed with a cover opening H0 as an opening corresponding to the intake port 131 of the fan 130. The cover opening H0 has a circular shape having a fan drive axis O (the center of rotation of the motor which rotates the blades of the fan 130) in its center, and has a diameter equal to or larger than an opening diameter of the intake port 131 of the fan 130. This makes it possible to smoothly introduce air within the duct to the intake port 131. Further, a cushion member 141 is affixed to the duct cover 140 in a manner covering an outer periphery of the cover opening H0. The cushion member 141 is held between the duct cover 140 and the fan 130 in a compressed state to prevent air leakage between the two members.

The duct base 100 is made of e.g. aluminum die cast which is a high thermal conductive material having high rigidity. The heat diffusion plate 201 is preferably made of a high thermal conductive material, such as a copper plate or an aluminum alloy plate. Heat generated on the front surface (surface facing in the positive x-axis direction) of the main circuit board 300 is transferred to the first unit 1001 mainly via the members 301a to 301d. Then, the heat transferred to the first unit 1001 is diffused to the duct base 100 and a plurality of fin groups (first fin groups 110 and second fin groups 120 (see FIG. 10)) which are integrally arranged on the duct base 100 (the first and second fin groups 110 and 120 will be described hereinafter with reference to FIG. 10, etc.).

Although details will be described hereinafter with reference to FIG. 10 and other figures, in the state in which the first unit 1001 is assembled, two types of air flow passages leading to the intake port 131 are formed between the duct base 100 and the duct cover 140. These two types of air flow passages are first flow passages F1a in a first heat dissipation section F1 and second flow passages F2a in a second heat dissipation section F2 (see FIG. 10). The first duct opening H1 is an intake opening associated with the first heat dissipation section F1, and the second duct opening H2 is an intake opening associated with the second heat dissipation section F2. Passages from the first duct opening H1 to the cover opening H0 (or the intake port 131) are the first flow passages F1a, and passages from the second duct opening H2 to the cover opening H0 (or the intake port 131) are the second flow passages F2a. When the fan 130 fixed to the duct base 100 is operated, outside air is sucked from the first duct opening H1 and the second duct opening H2. With this, air is ventilated between the plurality of the first and second fin groups 110 and 120 arranged on the duct base 100, and heat of the first and second fin groups 110 and 120 is transferred to the air. The air flowing into the duct is guided to the intake port 131 of the fan 130 via the cover opening H0 of the duct cover 140, and then discharged from the exhaust port 132.

Figure 6:
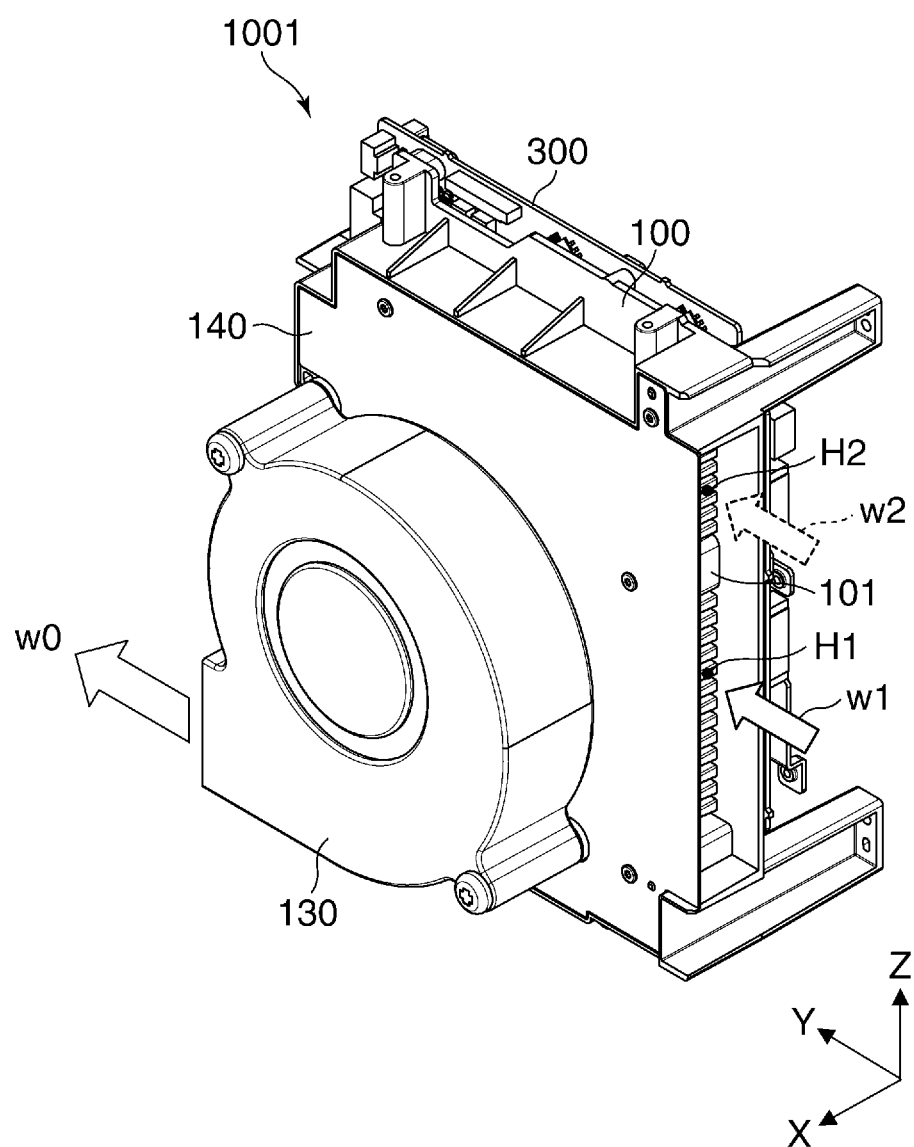
FIG. 6 is a perspective view of a first unit in an assembled state.

FIG. 6 is a perspective view of the first unit 1001 in the assembled state. Air sucked from the first duct opening H1 and air sucked from the second duct opening H2, respectively, flow along the two types of passages (the flow passages F1a and the flow passages F2a) formed between the duct base 100 and the duct cover 140 as first cooling air w1 and second cooling air w2. Then, the first and second cooling airs w1 and w2 cool the inside of the duct, and then discharged from the exhaust port 132 of the fan 130 as exhaust air w0.

The above-described intake and exhaust passages have a substantially closed structure except the intake and exhaust ports formed in the exhaust-side duct cover 6. Therefore, even if dust, water drops, and the like enter from the intake and exhaust ports, it is possible to collect them within the air flow passage or discharge them from the exhaust port. This makes it possible to prevent the image pickup apparatus 1 from being lowered in its performance or suffering from a failure due to the dust or water drops having entered the intake and exhaust passages.

On the other hand, heat generated on the rear surface (surface facing in the negative x-axis direction) of the main circuit board 300 is mainly diffused to the heat diffusion plate 201 and the main circuit board holder 200 (see FIG. 5), forming the second unit 1002. After that, the heat is dissipated to air within the image pickup apparatus 1, and then naturally dissipated to outside air via the exterior of the image pickup apparatus 1. A comparison made between the heat dissipation passages for dissipating heat from the front surface (surface facing in the positive x-axis direction) and from the rear surface (surface facing in the negative x-axis direction) of the main circuit board 300, respectively, indicates that forced air cooling by the first unit 1001 positioned on the front surface-side of the main circuit board 300 is dominant. For this reason, it is desirable to concentratedly arrange ones of the mounted components, which are relatively large in the amount of heat generation, on the front surface (surface facing in the positive x-axis direction) of the main circuit board 300. Note that a ground pattern (not shown) formed on the main circuit board 300 is in contact with the duct base 100. This makes it possible to transfer the heat of the main circuit board 300 itself to the duct base 100.

Figure 7:
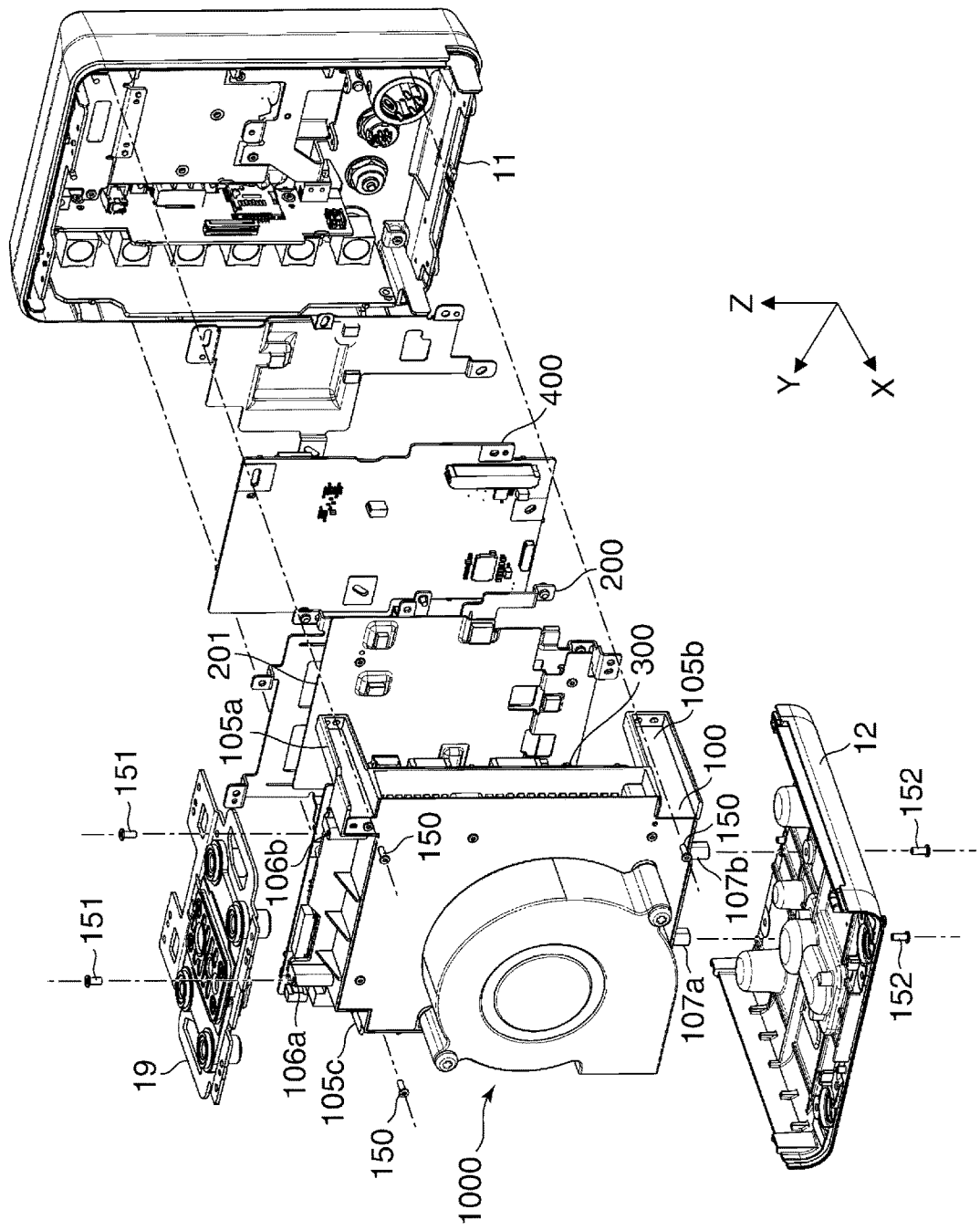
FIG. 7 is an exploded perspective view of the image pickup apparatus including essential components of the heat dissipation structure.

FIG. 7 is an exploded perspective view of the image pickup apparatus 1, including essential components of the heat dissipation structure. The heat dissipation unit 1000 is arranged to be surrounded by a sheet metal member 19 at the top, the bottom cover 12 at the bottom, and the rear cover 11 at the rear (see e.g. FIG. 3). Further, by assembling the top cover unit to the image pickup apparatus 1 as shown in FIG. 2, the heat dissipation unit 1000 is also held in the left-right direction (positive and negative y-axis directions). As described above, the top cover 4 is formed into the substantially U-shape opening in the negative z-axis direction. In a state in which the top cover unit is assembled, part of the top cover unit having the intake-side duct cover 5 and part of the same having the exhaust-side duct cover 6 are positioned such that they sandwich the heat dissipation unit 1000 including the duct base 100, in the left-right direction.

As shown in FIG. 7, arm portions 105a, 105b, and 105c, as a plurality of first extended portions, are formed to extend from the duct base 100 rearward in the optical axis direction (in the negative x-axis direction) such that they surround the main circuit board 300. Tip ends of the arm portions 105a, 105b, and 105c are fixed to the rear cover 11 with screws 150. Further, bosses 106a and 106b are formed to protrude from the upper end portion of the duct base 100 in the positive z-axis direction, and are fixed to the sheet metal member 19 with screws 151. Bosses 107a and 107b, as a plurality of second extended portions, are formed to protrude from the lower end portion of the duct base 100 in the negative z-axis direction, and are fixed to the bottom cover 12 with screws 152. Heat of the main circuit board 300 is mainly dissipated by forced cooling. However, part of heat of the duct base 100 is transferred to the rear cover 11 and the bottom cover 12 via the arm portions 105a, 105b, and 105c and the bosses 107a and 107b, for dissipation. The rear cover 11 and the bottom cover 12 are both made of a metallic material, such as magnesium die cast. For this reason, heat transferred from the duct base 100 is diffused in the covers and naturally dissipated, and hence compared with a cover formed of e.g. resin, a higher heat dissipation effect can be obtained, and it is easy to prevent occurrence of a heat spot (spot where the temperature is locally high).

Incidentally, the respective locations of the fan 130, the duct base 100, the main circuit board 300, the rear cover 11, and the bottom cover 12 can be summarized by the following arrangement relationship: The main circuit board 300 is arranged with respect to the duct base 100 on a side thereof opposite from the fan 130 (toward the negative x-axis direction). The rear cover 11 is arranged with respect to the main circuit board 300 on a side thereof opposite from the fan 130 (toward the negative x-axis direction), and forms part of the exterior. The bottom cover 12 and the top cover 4 form part of the exterior in directions (positive and negative z-axis directions) substantially orthogonal to the direction in which the duct base 100 and the main circuit board 300 are laminated.

As shown in FIGS. 2 and 3, the sheet metal member 19 is fixed to the front cover 13 and the rear cover 11 in the upper part of the image pickup apparatus 1 such that the sheet metal member 19 connects between the front cover 13 and the rear cover 11. The bottom cover 12 is fixed to the front cover 13 and the rear cover 11 in the lower part of the image pickup apparatus 1 such that the bottom cover 12 connects between the front cover 13 and the rear cover 11. As described above, the duct base 100 has the upper end portion and the lower end portion thereof fixed to the sheet metal member 19 and the bottom cover 12, with the bosses 106a and 106b, and the bosses 107a and 107b, respectively, and further has a rear portion thereof fixed to the rear cover 11 with the arm portions 105a, 105b, and 105c. By fixing as described above, it is possible to increase the rigidity of the image pickup apparatus 1 against an outer force, particularly a compression force applied in the optical axis direction or a torsional force. As described above, since the covers as the exterior are fixed by the duct base 100 formed of the material having high rigidity, such as aluminum die cast (part of the covers is fixed via the sheet metal member 19), it is possible to increase the rigidity of the image pickup apparatus 1 without adding a new component for increasing the rigidity. Although the upper end portion (bosses 106a and 106b) of the duct base 100 is fixed to the sheet metal member 19, the upper end portion of the duct base 100 may be fixed to the top cover 4 which is positioned on the top surface of the electronic apparatus. Note that the top cover 4 may also be formed of a metallic material.

Figure 8:
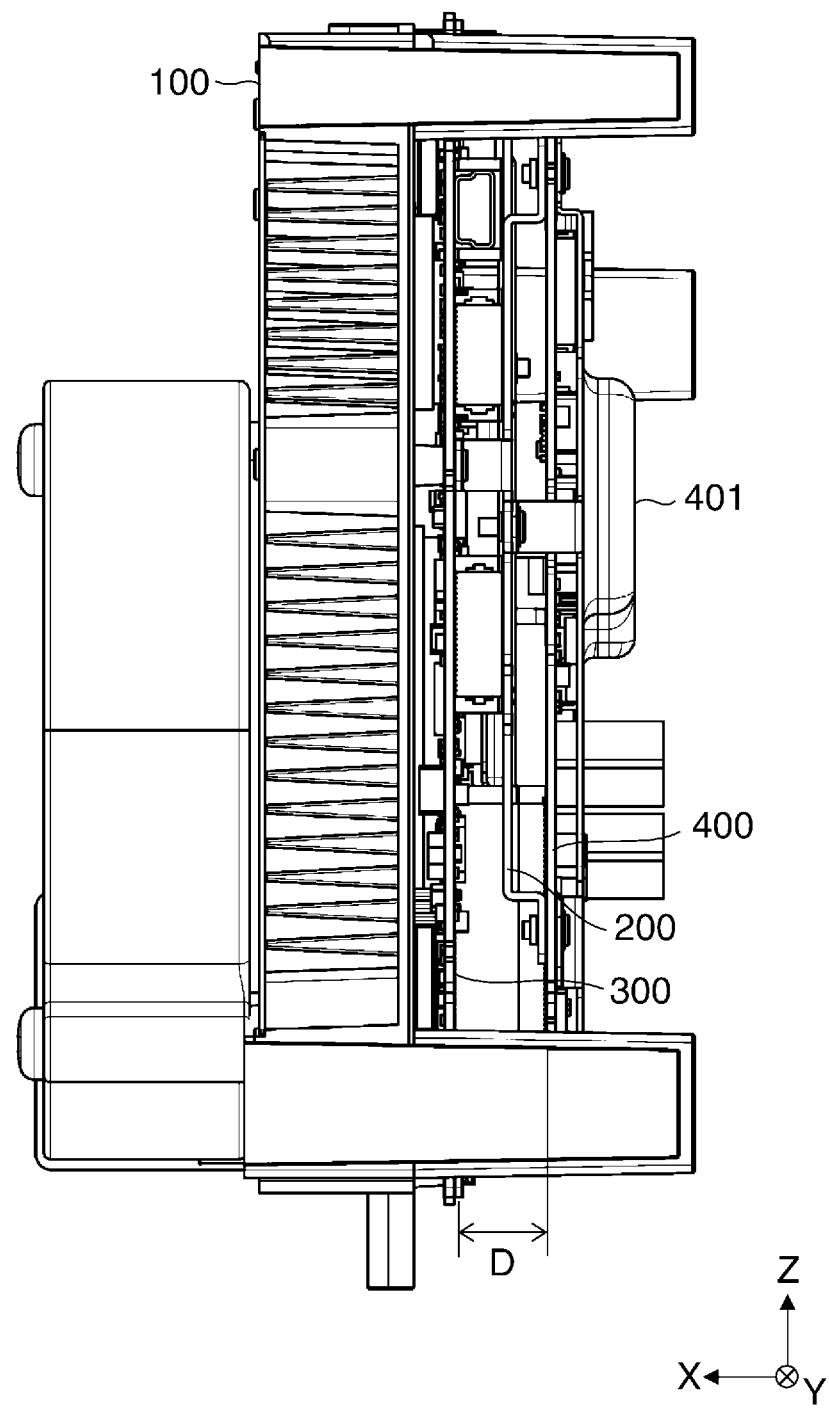
FIG. 8 is a side view of a duct base on which a main circuit board and a power supply circuit board are mounted.

A power supply circuit board 400 is fixed to the duct base 100 via the main circuit board holder 200, and is electrically connected to the main circuit board 300 via connectors, not shown. FIG. 8 is a side view of the duct base 100, on an x-z plane, in which the main circuit board 300 and the power supply circuit board 400 are mounted. As shown in FIG. 8, a space having a distance D is formed between the main circuit board 300 and the power supply circuit board 400. This space is formed to prevent the components mounted on the surfaces of the circuit boards from being contacted with each other, and make it difficult to transfer heat generated from the main circuit board 300 to the power supply circuit board 400, and the value of the distance D is determined to be suitable for these purposes. Further, heat generated from the power supply circuit board 400 is diffused to a heat diffusion plate 401 provided on a rear surface side (side facing in the negative x-axis direction) of the power supply circuit board 400, and then naturally dissipated. From this point of view, it is desirable to concentratedly arrange ones of the mounted components, which are relatively large in the amount of heat generation, on the rear surface (surface facing in the negative x-axis direction) of the power supply circuit board 400.

Figure 9:
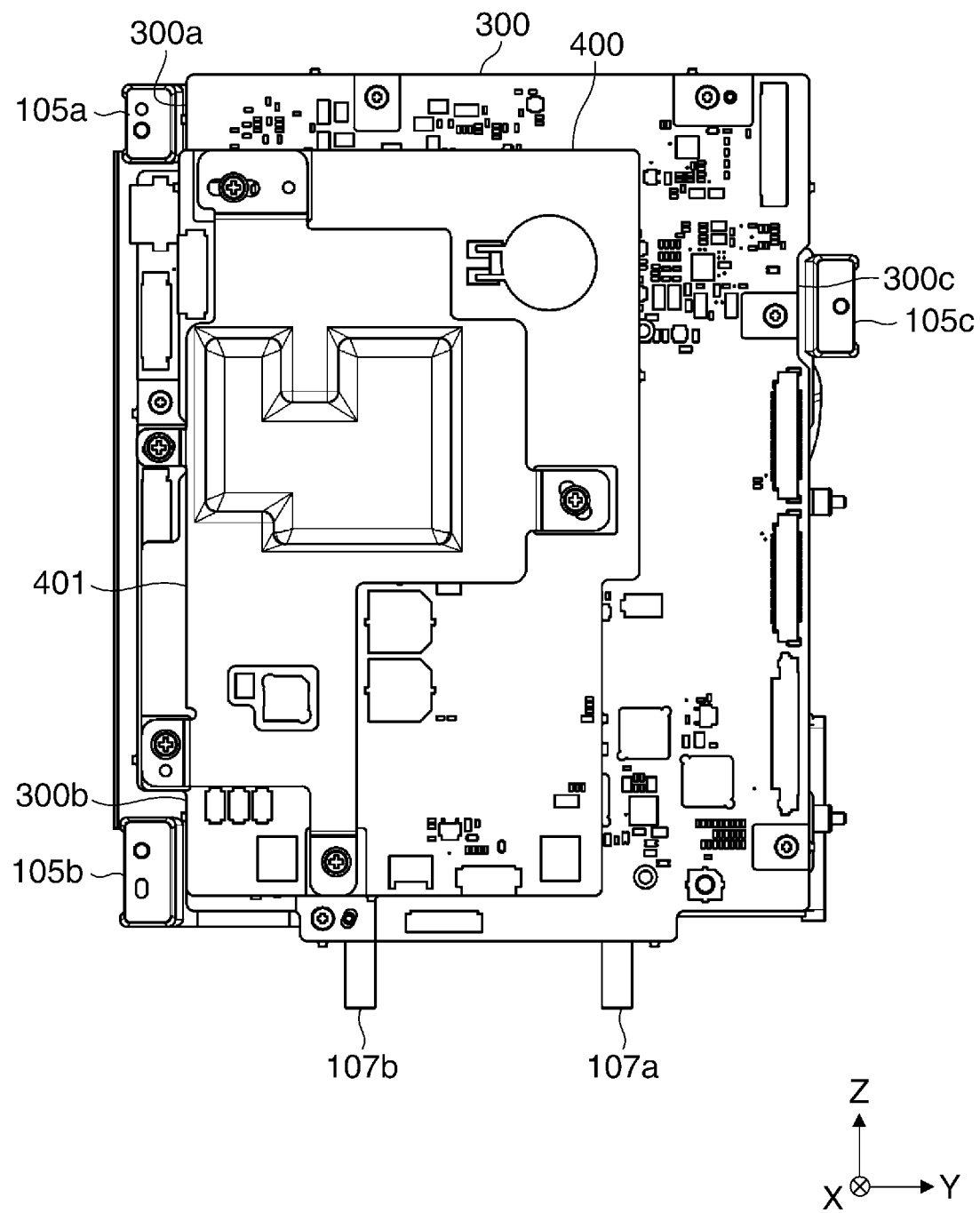
FIG. 9 is a rear view of the duct base on which the main circuit board and the power supply circuit board are mounted.

FIG. 9 is a rear view of the duct base 100 on which the main circuit board 300 and the power supply circuit board 400 are mounted. The main circuit board 300 is formed with relief portions 300a, 300b, and 300c each having a recessed shape. The relief portions 300a, 300b, and 300c are formed to avoid interference with the arm portions 105a, 105b, and 105c of the duct base 100, respectively, and are each formed into a shape cut out to avoid the arm portions 105a, 105b, and 105c. This makes it possible to connect the duct base 100 and the rear cover 11 such that heat can be transferred without increasing the size of the duct base 100, and prevent the outer shape of the image pickup apparatus 1 from being increased. The main circuit board 300 is directly connected to the duct base 100, and the duct base 100 is connected to the metallic external covers (covers, 11, 12, and so forth) as described above. By connecting these components as above, a difference in potential between the ground pattern of the main circuit board 300 and the exterior cover is eliminated, whereby it is possible to ensure stable grounding. Further, since the main circuit board 300 is covered by the metallic components (covers 11 and 12, and the sheet metal member 19), it is possible to expect an effect of shielding the components from unnecessary electromagnetic waves from the outside.

Figure 10:
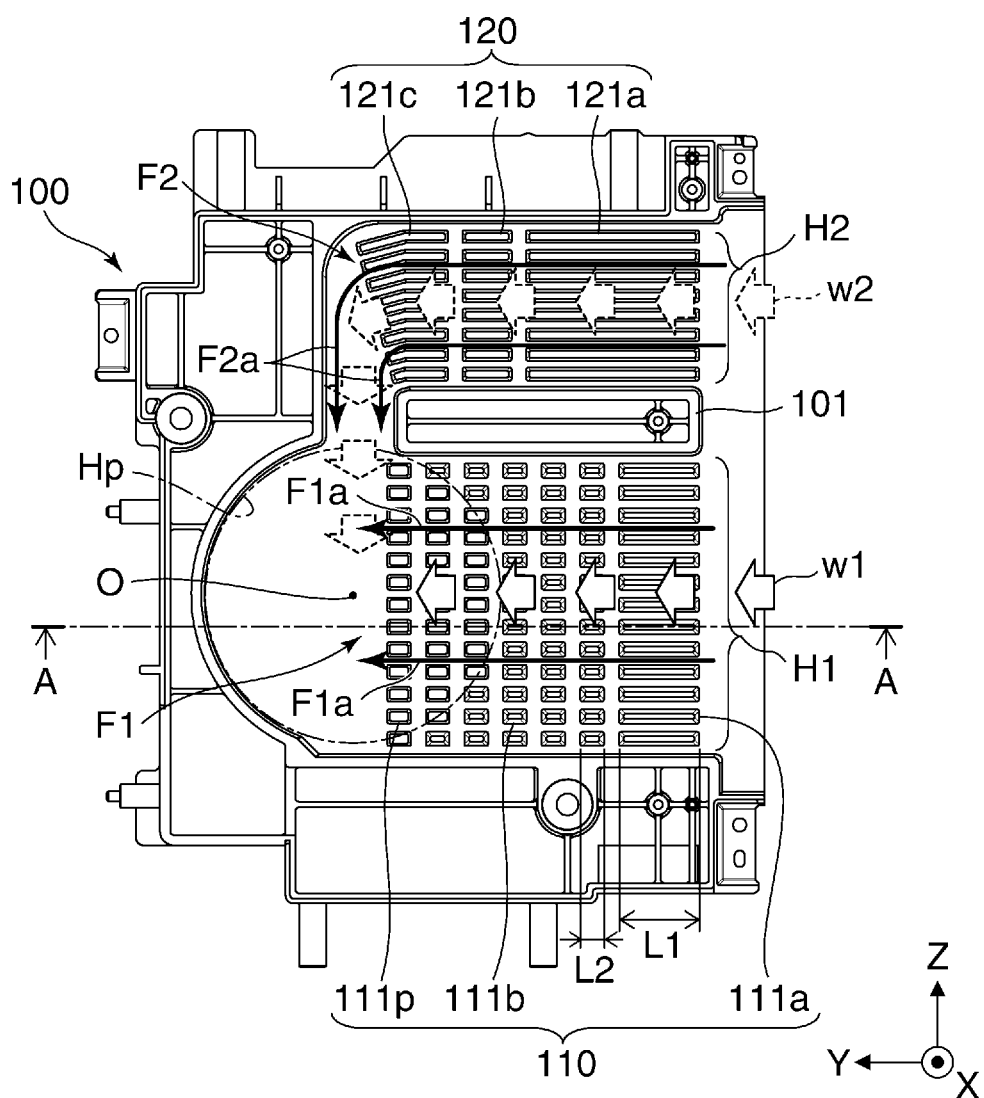
FIG. 10 is a front view of the duct base.

FIG. 10 is a front view of the duct base 100. A circle Hp indicated by a dashed-dotted line in FIG. 10 is a shape of a shadow projection of the cover opening H0 (see FIG. 5) onto the duct base 100. The first heat dissipation section F1 and the second heat dissipation section F2 are separated by a partition wall 101. That is, the first flow passages F1a from the first duct opening H1 to the intake port 131 and the second flow passages F2a from the second duct opening H2 to the intake port 131 are formed in a state separated by the partition wall 101. The first heat dissipation section F1 is provided at a location corresponding to the mounted components 311a and 311b, and the second heat dissipation section F2 is provided at a location corresponding to the mounted components 311c and 311d. The mounted components 311c and 311d are arranged within an area of a shadow projection of the first heat dissipation section F1 onto the main circuit board 300, and the mounted components 311a and 311b are arranged within an area of a shadow projection of the second heat dissipation section F2 onto the main circuit board 300, as viewed in the x-axis direction.

A direction of main flow of each of air flowing through the first flow passages F1a and air flowing through the second flow passages F2a is referred to as the main flow direction. Each first flow passage F1a forms a substantially linear shape, and the first cooling air w1 linearly flows in the main flow direction through the first flow passage F1a. On the other hand, each second flow passage F2a forms a substantially bent shape which is bent through a substantially right angle at an intermediate portion in the main flow direction. The second cooling air w2 flowing through the second flow passage F2a changes its advancing direction through a substantially right angle at the intermediate portion, and hence the second cooling air w2 is relatively larger in ventilation resistance than the first cooling air w1. Note that the two first and second cooling airs w1 and w2 are illustrated, by way of example, for ease of understanding, and in actuality, flow of air is generated in each entire air flow passage.

Here, the air flow passages have respective different lengths. The position of the fan drive axis O (position where the fan 130 is disposed) and the position of the cover opening H0 are designed to make the first flow passages F1a smaller in air flow passage length than the second flow passages F2a. Note that when comparing the length between the flow passages F1a and F2a, each length of the flow passages F1a and F2a is defined as the shortest distance from the duct opening H1 or H2 to the fan drive axis O. Alternatively, each length of the flow passages F1a and F2a may be defined as the shortest distance from the duct opening H1 or H2 to the rim of the intake port 131.

The first heat dissipation section F1 and the second heat dissipation section F2 each have a plurality of fins integrally formed on the duct base 100. More specifically, the first heat dissipation section F1 includes the plurality of first fin groups 110 (each formed by fins 111a, 111b, and 111p), and the second heat dissipation section F2 includes the plurality of second fin groups 120 (each formed by fins 121a, 121b, and 121c).

First, the plurality of first fin groups 110 are arranged in parallel in a direction substantially orthogonal to the main flow direction of the first flow passages F1a. Each first fin group 110 is divided with respect to the main flow direction into the plurality of fins, i.e. the fins 111a, 111b, and 111p which are arranged in the mentioned order at respective locations starting from closest to the first duct opening H1. Each of the fins 111a, 111b, and 111p is a ridge substantially parallel to the main flow direction, and protrudes in the positive x-axis direction. As to the length of the fins 111a, 111b, and 111p in the main flow direction of the first flow passage F1a, the fin 111a has a length L1 which is the largest, and the fins 111b and 111p have the same length L2, which is smaller than the length L1 of the fin 111a. The fins 111p are included in an area opposed to the cover opening H0. The fins 111a and 111b are equal to each other in protrusion height in the positive x-axis direction, and the fins 111p are smaller in protrusion height than the fins 111a and 111b (also described hereinafter with reference to FIG. 12).

The plurality of second fin groups 120 are arranged in parallel in a direction substantially orthogonal to the main flow direction of the second flow passages F2a. Each second fin group 120 is divided with respect to the main flow direction into a plurality of fins, i.e. the fins 121a, 121b, and 121c, which are arranged in the mentioned order starting from closet to the second duct opening H2. Each of the fins 121a, 121b, and 121c is a ridge substantially parallel to the main flow direction, and protrudes in the positive x-axis direction. The fins 121a, 121b, and 121c are different from each other in length in the main flow direction of the second flow passage F2a, and the fin 121a is the longest of the fins 121a, 121b, and 121c. The fins 121a, 121b, and 121c are equal to each other in protrusion height in the positive x-axis direction. Although the fins 121a and 121b each have a linear shape, the fin 121c has a shape gently curved at the bent portion of the second flow passage F2a. This suppresses increase in ventilation resistance at portions where the second cooling air w2 changes its direction of flow through a substantially right angle.

Figure 11:
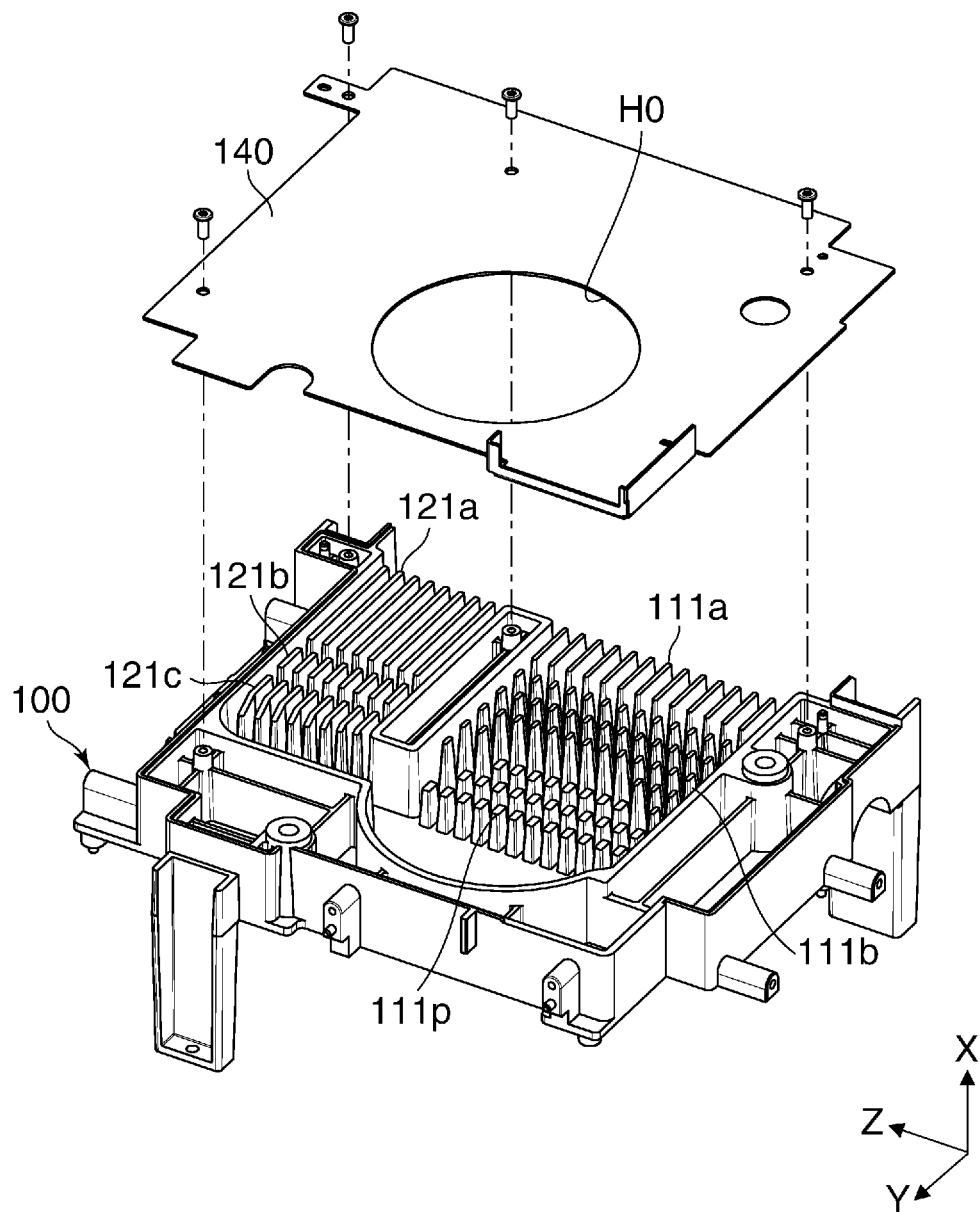
FIG. 11 is an exploded perspective view of a duct section.
Figure 12:
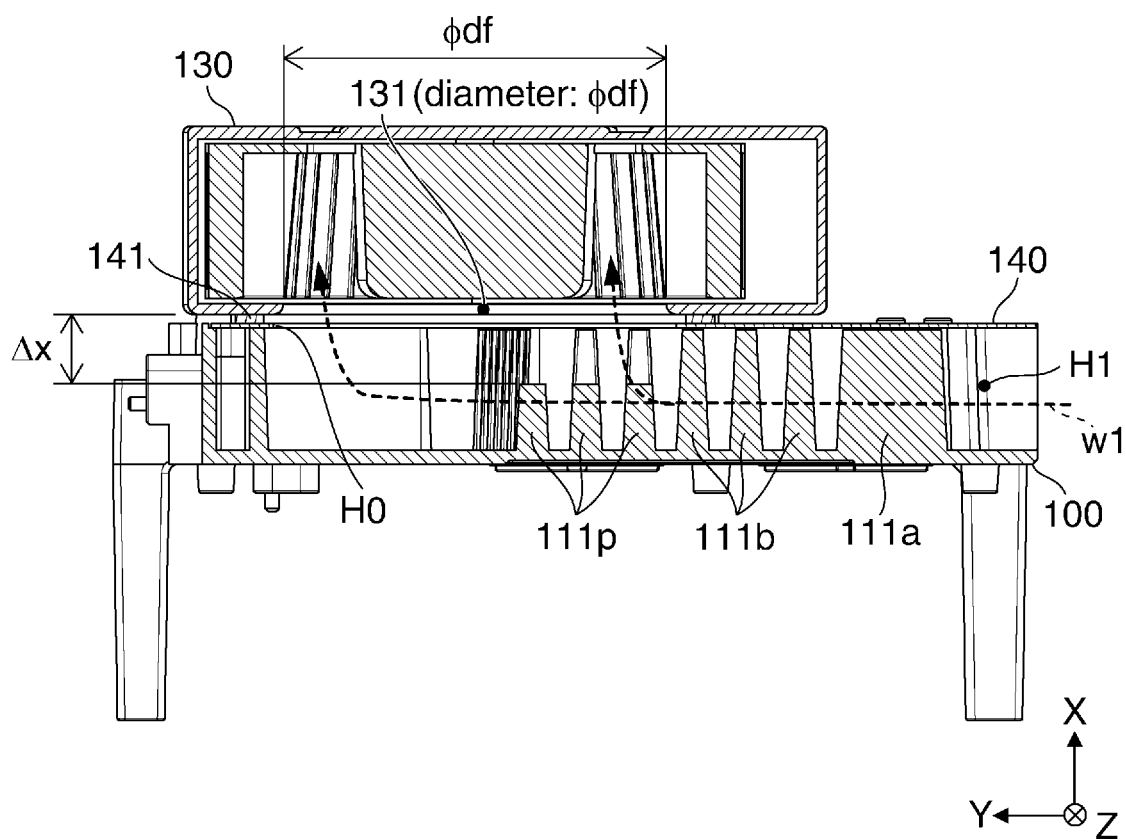
FIG. 12 is a cross-sectional view taken along A-A in FIG. 10.

FIG. 11 is an exploded perspective view of the duct section. FIG. 12 is a cross-sectional view taken along A-A in FIG. 10. By arranging the fins 111p in an area of a substantial shadow projection of the cover opening H0 onto the duct base 100, the heat dissipation performance of the first unit 1001 for the heat sources opposed to the intake port 131 is increased. Since the fins 111p are smaller in protrusion height than the other fins (fins 111a and 111b) arranged on the duct base 100, it is possible to avoid lowering of the performance of the fan 130 due to the influence of an obstacle in the vicinity of the intake port 131.

Arrows each indicated by a broken line in FIG. 12 represent the first cooling air w1. Similar to the fins 111a and 111b appearing in FIG. 12, all of the fins arranged on the duct base 100 except the fins 111p are formed to be high within a range in which the fins do not interfere with the duct cover 140. This makes it possible to reduce the space between the tip end of each fin and the duct cover 140 as much as possible to thereby allow the first cooling air w1 to positively pass between the fins.

The fins 111p are formed to be lower than the other fins in the positive x-axis direction, and a space having a length Δx is formed between the tip end of each fin 111p and the intake surface of the fan 130. If the length Δx of the space is too small, the performance of the fan is lowered by the influence of the fins 111p in the vicinity of the intake port 131. On the other hand, if the length Δx of the space is too large, the heat dissipation area of the duct base 100 opposed to the intake port 131 is reduced. In view of this, in the present embodiment, the height of the fins 111p is set such that an area expressed by the product of the length Δx and a circumferential length (π×ϕdf) of the intake port 131 becomes substantially equal to an opening area of the exhaust port 132 (see FIG. 4) of the fan 130. The value expressed by ϕdf is the diameter of the intake port 131. This increases the heat dissipation area of the duct base 100 opposed to the intake port 131 without lowering the performance of the fan (i.e. without reducing the amount of air flow).

Further, when the first cooling air w1 advances from the first duct opening H1 to the intake port 131, part of the first cooling air w1 passes the side surfaces and the tip ends of the fins 111p. As a result, the heat transfer rate at the fins 111p is increased, whereby it is possible to obtain a high heat dissipation effect in the area opposed to the intake port 131 of the fan 130, and achieve a uniform temperature in a wide range of the objects from which heat is to be dissipated.

Further, as shown in FIG. 10, the fins 111p are arranged only in part of the area opposed to the intake port 131 of the fan 130, more specifically, only in part of the area closer to the first duct opening H1 than the fan drive axis O is. Part, which is close to the fan drive axis O, of the area opposed to the intake port 131 is low in air flow velocity, and has a small temperature reduction effect. The fins 111p are not arranged in this area having the small temperature reduction effect, whereby it is possible to simplify the shape of each fin and reduce the weight of the same. Note that the arrangement of the fins is not limited to this, but for example, the fins 111p may be arranged in the whole area opposed to the intake port 131.

As described above, the first fin groups 110 and the second fin groups 120 are each formed by fins divided with respect to the respective main flow directions of the flow passages F1a and F2a associated therewith, whereby compared with the structure in which the fins extend without being divided, it is possible to increase the surface area and heat transfer rate of the fins that contribute to heat dissipation. This enables the first unit 1001 to have a high heat dissipation effect.

Further, the first heat dissipation section F1 is larger in the number of divided fins per unit length with respect to the main flow direction than the second heat dissipation section F2. In the illustrate example in FIG. 10, the number of fins of each first fin group 110 per unit length with respect to the main flow direction is larger than the number of fins of each second fin group 120. As the number of divided fins is larger, the surface area and the heat transfer rate are increased, but the ventilation resistance becomes larger, and hence an increase in the amount of the ventilation resistance is marked in the first heat dissipation section F1.

On the other hand, the first flow passage F1a is smaller in flow passage length than the second flow passage F2a, and is smaller in ventilation resistance, and hence even in a case where the fins are divided into a multiplicity of fins along the main flow direction, the first heat dissipation section F1 can ensure a sufficient ventilation air flow. Further, the first duct opening H1 is larger in opening area than the second duct opening H2, and it is easier to suck air into the first heat dissipation section F1 than into the second heat dissipation section F2. For this reason, it is easy to obtain a desired amount of air flow in the first heat dissipation section F1.

With this duct structure, it is possible to more efficiently dissipate heat from the first heat dissipation section F1 than from the second heat dissipation section F2. For this reason, the mounted components are arranged such that the total power consumption of the mounted components 311c and 311d, as the main objects from which heat is to be dissipated, of the first heat dissipation section F1 becomes larger than the total power consumption of the mounted components 311a and 311b, as the main objects from which heat is to be dissipated, of the second heat dissipation section F2. Note that it is desirable to concentratedly arrange the mounted components which are large in power consumption and the amount of heat generation, on the front surface (surface facing in the positive x-axis direction) of the main circuit board 300, and within the area of the shadow projection of the first heat dissipation section F1.

Further, since the first fin groups 110 and the second fin groups 120 are integrally formed on the duct base 100, it is possible to make the temperature of the circuit board more uniform than in a case where a plurality of ducts are provided to dissipate heat from the main circuit board 300. Therefore, it is possible to prevent the mounted components from being locally increased in temperature. Out of the fins provided in the heat dissipation sections F1 and F2, the fins closest to the duct openings H1 and H2 (fins 111a and 121a) are longer than the fins adjacent thereto on the downstream side in the main flow direction (fins 111b and 121b). This makes it possible to prevent air sucked from the outside from being excessively warmed in the vicinity of the inlets of the flow passages F1a and F2a. Therefore, relatively cool air also flows into the downstream part of the flow passages, whereby it is possible to make more uniform the temperature in a range from the upstream part to the downstream part of the flow passages. Note that the fins may be progressively reduced in length toward the downstream ends of the flow passages F1a and F2a.

According to the present embodiment, the flow passage length of the second flow passage F2a is larger than that of the first flow passage F1a, and the first fin groups 110 arranged in the first heat dissipation section F1 are each formed by a plurality of fins divided with respect to the main flow direction of the first flow passage F1a. The first fin groups 110 arranged in the first heat dissipation section F1 is larger in the number of fins per unit length in the main flow direction than the second fin groups 120 arranged in the second heat dissipation section F2. That is, the number of divided fins in the flow passage which is smaller in flow passage length is made relatively larger, whereby it is possible to realize an effective heat dissipation structure, by taking into account a balance of the heat transfer amount between the heat sources distributed in a wide range. What is more, since the fan 130 is a single fan, the apparatus is prevented from being increased in size. Therefore, it is possible to improve the heat dissipation efficiency, and more particularly, it is possible to make the temperatures of the circuit board and the components mounted on the circuit board uniform without increasing the size of the apparatus even when there is a heat generation amount distribution on the circuit board.

Further, the total power consumption of the mounted component group arranged on the area of the shadow projection of the first heat dissipation section F1 onto the main circuit board 300 is larger than the total power consumption of the mounted component group arranged on the area of the shadow projection of the second heat dissipation section F2 onto the main circuit board 300. Therefore, heat is largely dissipated from the first heat dissipation section F1 which is relatively high in heat dissipation efficiency, which contributes to making uniform the temperatures of the mounted components.

Note that out of the fins arranged in the heat dissipation sections F1 and F2, at least the first fin groups 110 are only necessarily required to be divided into the plurality of fins along the main flow direction, but the second fin groups 120 are not necessarily required to be divided.

According to the present embodiment, further, the duct base 100 includes the first extended portions (the arm portions 105a, 105b, and 105c) extended in a manner surrounding the periphery of the main circuit board 300, and the second extended portions (the bosses 107a and 107b) extended in the negative z-axis direction. Further, the arm portions 105a, 105b, and 105c are fixed to the rear cover 11 (first cover) arranged on the rear side of the apparatus, and the bosses 107a and 107b are fixed to the bottom cover 12 (second cover) arranged on the bottom side of the apparatus. With this arrangement, heat of the duct base 100 is transferred to the rear cover 11 and bottom cover 12, which are made of the metallic material, and is efficiently dissipated. Therefore, it is possible to improve the heat dissipation efficiency. Further, not only the arm portions 105a, 105b, and 105c are fixed to the rear cover 11, and the bosses 107a and 107b are fixed to the bottom cover 12, but also the bosses 106a and 106b are fixed to the sheet metal member 19. With this arrangement, it is possible to increase the rigidity of the image pickup apparatus 1 without increasing the number of components. What is more, since the top cover 4 (third cover) having the substantially U-shape, which covers the duct section from above and the opposite lateral sides, is arranged in a manner sandwiching (holding) the duct section (particularly, the duct base 100) in the left-right direction, the image pickup apparatus 1 having a more sturdy structure is realized.

Further, since the main circuit board 300 is formed with the relief portions 300a, 300b, and 300c, for avoiding interference with the arm portions 105a, 105b, and 105c, these contribute to size reduction of the image pickup apparatus 1.

Figure 13:
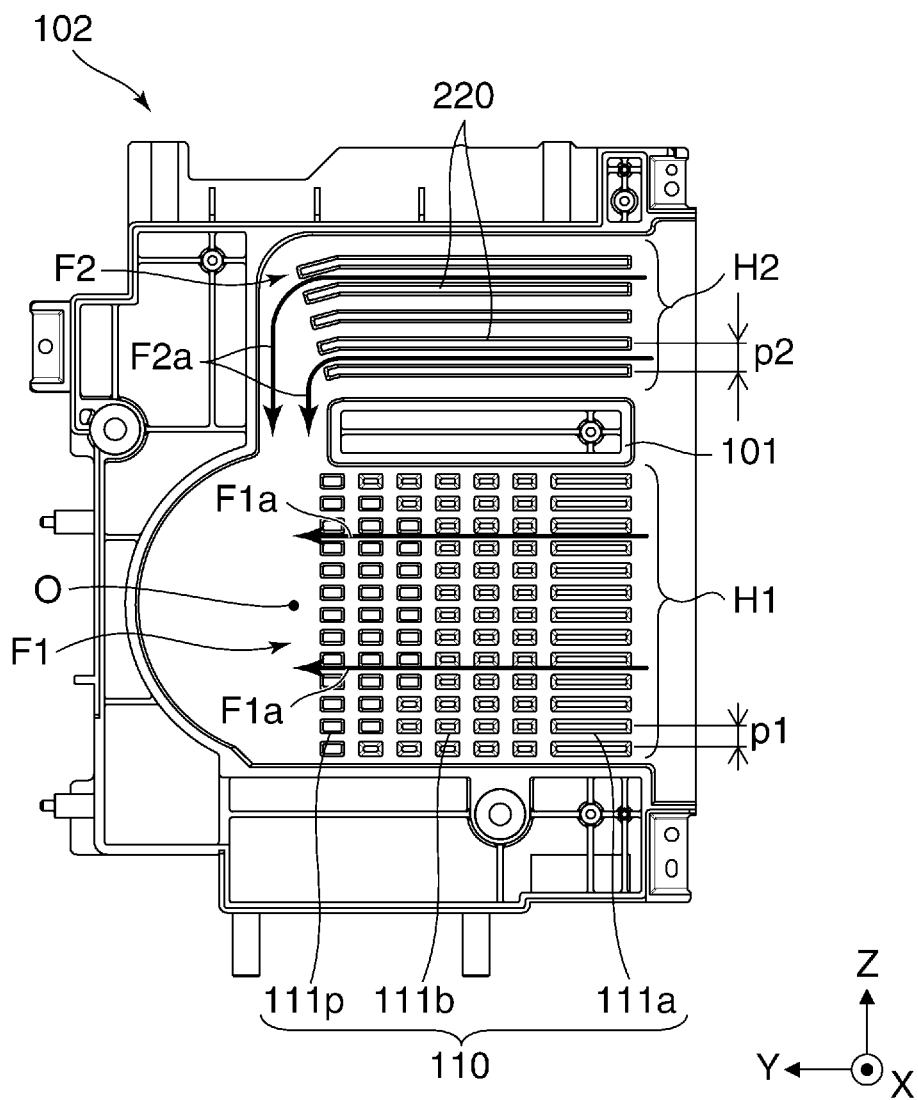
FIG. 13 is a front view of a duct base of an image pickup apparatus as an electronic apparatus according to a second embodiment of the present invention.

Next, a description will be given of a second embodiment of the present invention. FIG. 13 is a front view of a duct base 102 of an electronic apparatus according to the second embodiment. The present embodiment differs from the first embodiment in that the duct base 102 is provided in place of the duct base 100. The same components as those of the first embodiment are denoted by the same reference numerals, and description thereof is omitted.

The duct base 102 includes second fins 220 as components corresponding to the second fin groups 120. The second fins 220 are different in shape from the second fin groups 120 of the duct base 100, and are not divided. Further, although in the duct base 100 of the first embodiment, the first and second fin groups 110 and 120 are equal to each other in the arrangement pitch in the direction orthogonal to the main flow direction, in the duct base 102, the first fin groups 110 and the second fins 220 are different in the arrangement pitch. The other configuration of the duct base 102 is the same as that of the duct base 100.

The plurality of first fin groups 110 are arranged at a pitch p1 in parallel with each other in the direction orthogonal to the main flow direction of the first flow passage F1a (substantially in the z-axis direction). The plurality of second fins 220 are arranged at a pitch p2 in parallel with each other in the direction orthogonal to the main flow direction of the second flow passage F2a. The pitch p1 is smaller than the pitch p2. This makes it possible to arrange relatively a larger number of fins in the first heat dissipation section F1, and thereby increase the heat dissipation area. As mentioned above, since the first heat dissipation section F1 is smaller in flow passage length than the second heat dissipation section F2, even in the case where the first fin groups 110 are arranged at a narrower pitch in the first heat dissipation section F1 as above, it is possible to obtain a sufficient amount of air flow. On the other hand, in the second heat dissipation section F2 which is relatively large in flow passage length, the pitch p2 of the fins is increased to thereby reduce the ventilation resistance, whereby it is possible to obtain a necessary amount of air flow. This makes it possible to perform well-balanced air cooling.

According to the present embodiment, it is possible to obtain the same advantageous effects as provided by the first embodiment in making uniform the temperatures of a circuit board and components mounted on the circuit board without increasing the size of the apparatus even when there is a heat generation amount distribution on the circuit board. Further, since the pitch p2 of the second fins 220 is larger than the pitch p1 of the first fin groups 110, it is possible to reduce the ventilation resistance in the second heat dissipation section F2, and thereby obtain a necessary amount of air flow. Therefore, for example, even in a case where the static pressure of the fan is relatively small and hence it is difficult to cause a necessary amount of air to flow through the second heat dissipation section F2, such as a case where the fan 130 is rotated at a low rational speed, or a case where a small-size fan is used, it is possible to make uniform the temperatures of the objects from which heat is to be dissipated.

Although each of the second fins 220 provided in the second heat dissipation section F2 is not divided with respect to the main flow direction from the viewpoint of reduction of ventilation resistance, each fin 220 may be divided into a plurality of fins with respect to the main flow direction, similar to the first embodiment.

Figure 14:
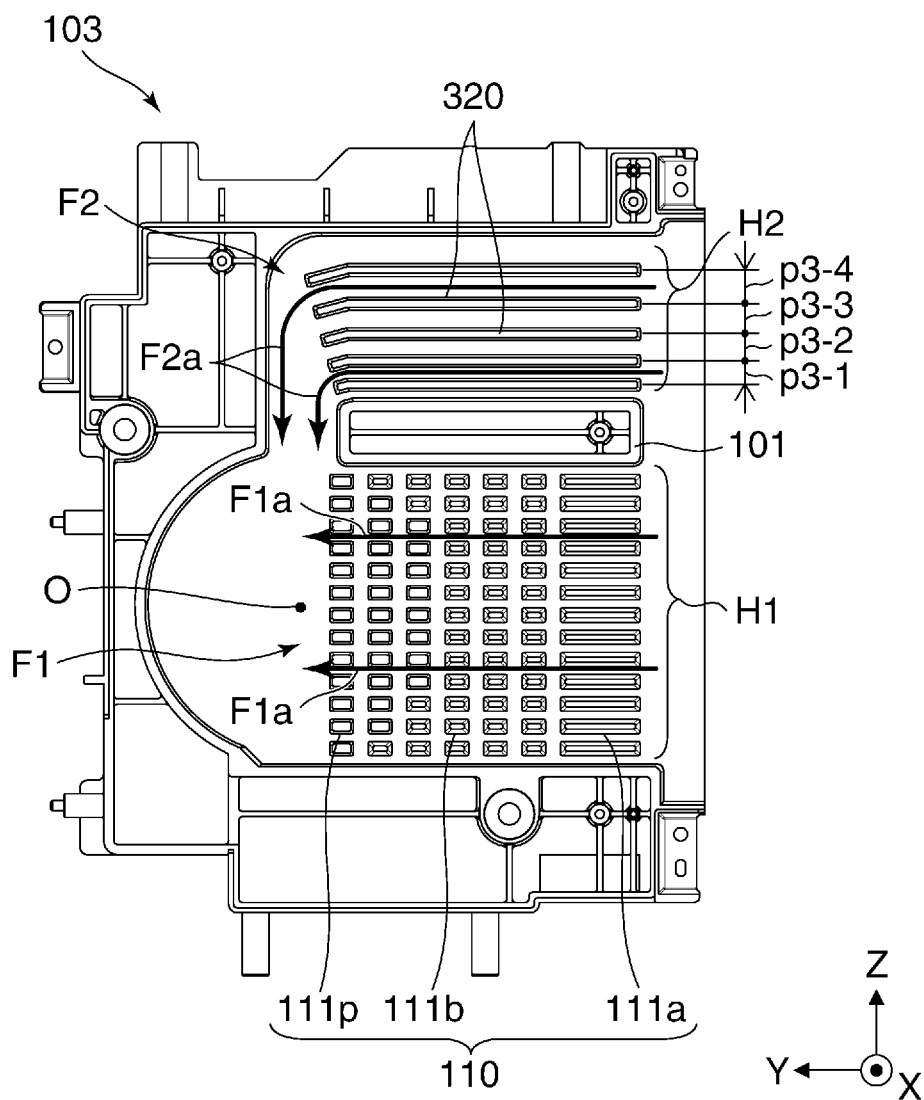
FIG. 14 is a front view of a duct base of an image pickup apparatus as an electronic apparatus according to a third embodiment of the present invention.

Next, a description will be given of a third embodiment of the present invention. FIG. 14 is a front view of a duct base 103 of an electronic apparatus according to the third embodiment. The present embodiment differs from the first embodiment in that the duct base 103 is provided in place of the duct base 100. The same components as those of the first embodiment are denoted by the same reference numerals, and description thereof is omitted.

The duct base 103 includes second fins 320 as components corresponding to the second fin groups 120. The second fins 320 are different in shape from the second fin groups 120 of the duct base 100, and are not divided. Further, although in the duct base 100 of the first embodiment, the first and second fin groups 110 and 120 are equal in arrangement pitch in the direction orthogonal to the main flow direction, in the duct base 103, the arrangement pitch of the second fins 320 is varied in the arranging direction. More specifically, spacing (pitch) between the second fins 320 adjacent to each other is smaller as the distance from the fan drive axis O is smaller. The arrangement pitch of the second fins 320 is gradually increased in the order of a pitch p3-1, a pitch p3-2, a pitch p3-3, and a pitch p3-4 from the closest one to the fan drive axis O. Although the number of the second fins 320 is set to five, this is not limitative. The other configuration of the duct base 103 is the same as that of the duct base 100.

By setting the arrangement pitch of the second fins 320 as above, it is possible to make the amount of air flow uniform between the second fins 320 of the second heat dissipation section F2 regardless of the distance from the intake port 131. This makes it possible to make more uniform the temperature of the main circuit board 300 as the object to be cooled.

According to the present embodiment, it is possible to obtain the same advantageous effects as provided by the first embodiment in making uniform the temperatures of a circuit board and components mounted on the circuit board without increasing the size of the apparatus even when there is a heat generation amount distribution on the circuit board. Further, even when the heat generation amount distribution in the second heat dissipation section F2 is not uniform, it is possible to make uniform the temperatures of the objects from which heat is to be dissipated.

Although the second fins 320 arranged in the second heat dissipation section F2 are not divided with respect to the main flow direction from the viewpoint of reduction of ventilation resistance, the second fins 320 may be divided into a plurality of fins with respect to the main flow direction, similar to the first embodiment.

Although in the first and second embodiments, the structure having two heat dissipation sections (flow passages) is described by way of example, the heat dissipation sections (flow passages) may be increased to three or more according to the distribution of heat sources requiring heat dissipation. In this case, two of the three or more heat dissipation sections may satisfy the relationship between the first heat dissipation section F1 and the second heat dissipation section F2 described in the embodiments. For example, it is desirable that at least fins arranged in a heat dissipation section which is the smallest in flow passage length are each divided with respect to the main flow direction into a plurality of fins.

Next, a description will be given of a fourth embodiment of the present invention. In general, the image pickup apparatus is sometimes used outdoor. In a case where the image pickup apparatus is used in temporal outdoor photographing, rainwater or the like may enter the image pickup apparatus in stormy weather. Therefore, as a simple measure for preventing rainwater or the like from entering the image pickup apparatus, the image pickup apparatus is sometimes covered with a rain cover using a waterproof material. In this case, if a vent hole of the image pickup apparatus for heat dissipation is blocked by the rain cover, the heat dissipation amount is reduced, and hence there is a fear that the temperature of the apparatus may become abnormally high. Particularly, in an apparatus including a fan, a force in a direction in which the rain cover is sucked into the apparatus by intake air is applied to the rain cover, which can block the ventilation passage, causing the heat dissipation amount to be markedly reduced. Further, since the outside of the apparatus is covered with the rain cover, smooth heat discharge to outside air by the fan is inhibited, and part of exhaust heat, which has not been discharged to the outside, remains in a space between the rain cover and the exterior of the apparatus, which accelerates increase in the temperature of the apparatus. Further, if part of the exhaust heat is transferred around to the intake side, increase in the temperature of the apparatus is further accelerated. As described above, there is a fear that attachment of the rain cover may cause increase in the temperature of the apparatus. To solve this problem, the fourth embodiment of the present invention provides an accessory for an electronic apparatus, which can be removably attached to the electronic apparatus body. The attachment of this accessory prevents the vent hole from being blocked due to the attachment of the rain cover, and the exhaust heat from being transferred around to the intake side. In the present embodiment, as an electronic apparatus to which the accessory can be attached, the image pickup apparatus 1 described in the first embodiment is taken as an example.

Figure 15A:
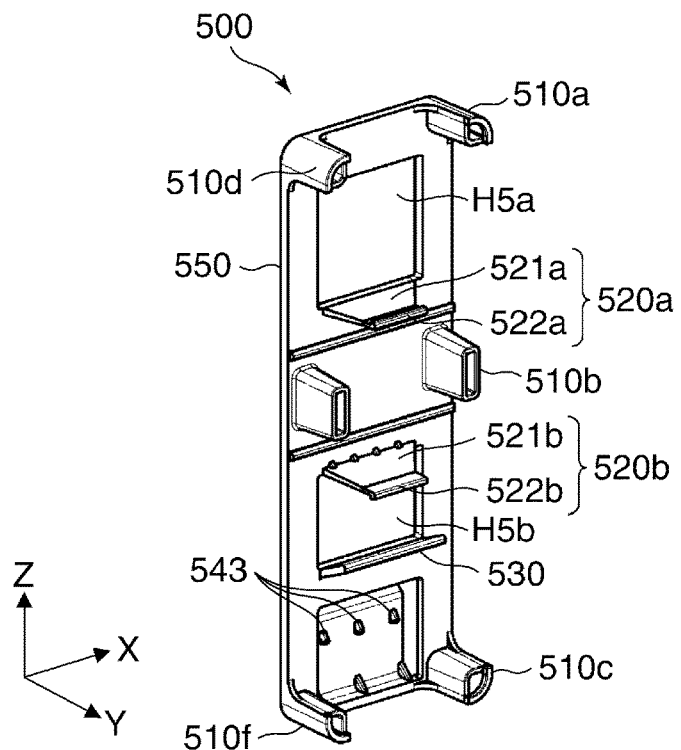
FIG. 15A is a perspective view of an accessory, which is mounted on an image pickup apparatus as an electronic apparatus according to a fourth embodiment of the present invention, as viewed from the inside.
Figure 15B:
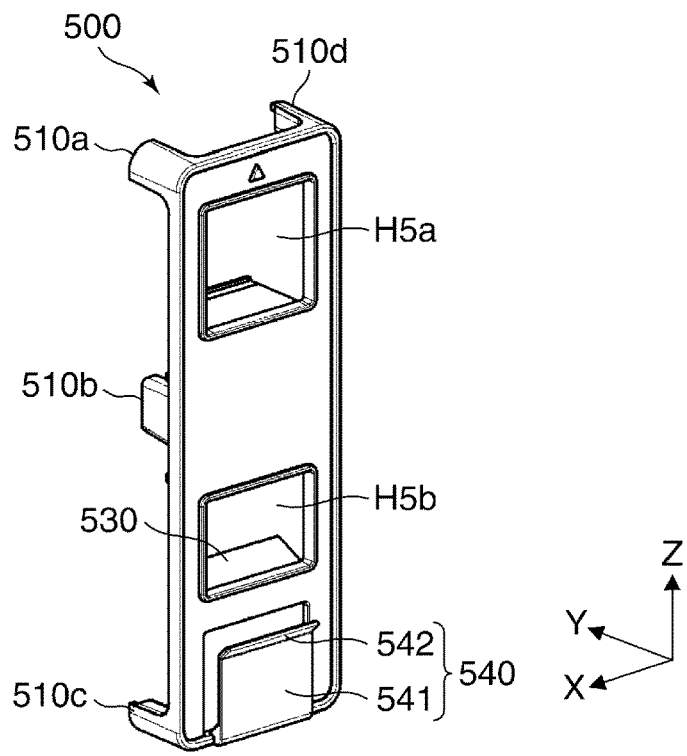
FIG. 15B is a perspective view of the accessory, shown in FIG. 15A, as viewed from the outside.

FIGS. 15A and 15B are perspective views of the accessory according to the fourth embodiment, which is attached to the image pickup apparatus as the electronic apparatus. This accessory, denoted by reference numeral 500, can be attached and removed to and from the image pickup apparatus 1. In FIGS. 15A and 15B, the accessory 500 is shown in a state attached to the image pickup apparatus 1, as viewed from the inside and the outside of the image pickup apparatus 1, respectively.

The accessory 500 includes a substantially plate-shaped base portion 550. A plurality of extended portions 510 (510a, 510b, 510c, 510d, and 510f) are extended substantially orthogonally from the base portion 550. Further, the base portion 550 is formed with gripping openings H5a and H5b as through holes which are arranged in parallel in a longitudinal direction of the base portion 550. In the state attached to the image pickup apparatus 1, the longitudinal direction of the base portion 550 is the positive and negative z-axis directions, and the direction in which the extended portions 510 are extended is substantially parallel to the y-axis direction. In the following description, directions in the accessory 500 are referred to with reference to the attached state. The base portion 550 has an attachment piece 520a formed on the same side as the extended portions 510 such that the attachment piece 520a is extended from a rim of the gripping opening H5a on a side toward the negative z-axis direction, and an attachment piece 520b formed on the same side as the extended portions 510 such that the attachment piece 520b is extended from a rim of the gripping opening H5b on a side toward the positive z-axis direction. The attachment pieces 520a and 520b include elastic pieces 521a and 521b, respectively. The elastic pieces 521a and 521b are both elastically deformable in the z-axis direction. The elastic pieces 521a and 521b have tip ends which are formed with latching lugs 522a and 522b, respectively.

Further, the base portion 550 has a louver 530 formed on the same side as the extended portions 510, for regulating the flow of air, such that the louver 530 is extended from a rim of the gripping opening H5b on a side toward the negative z-axis direction. Further, a regulating portion 540 is formed on an opposite side to the extended portions 510 such that the regulating portion 540 is extended in substantially parallel to the base portion 550 from an end portion of the base portion 550 on a side toward the negative z-axis direction. The regulating portion 540 includes an elastic portion 541, and the elastic portion 541 is formed with anti-slip ribs 543. The tip end of the elastic portion 541 forms a guide portion 542 which is bent. The regulating portion 540 holds an end portion of a rain cover 600 (see FIG. 19) between the elastic portion 541 and the base portion 550 to thereby regulate the position of the end portion of the rain cover 600. The anti-slip ribs 543 prevent the attached rain cover 600 from being displaced. The guide portion 542 guides the rain cover 600 to a position between the elastic portion 541 and the base portion 550 when attaching the rain cover 600. The above-described components of the accessory 500 are integrally formed by resin molding. Note that the components of the accessory 500 except the anti-slip ribs 543 may be integrally formed, and a member having higher elasticity than other part may be used for the anti-slip ribs 543.

Figure 16:
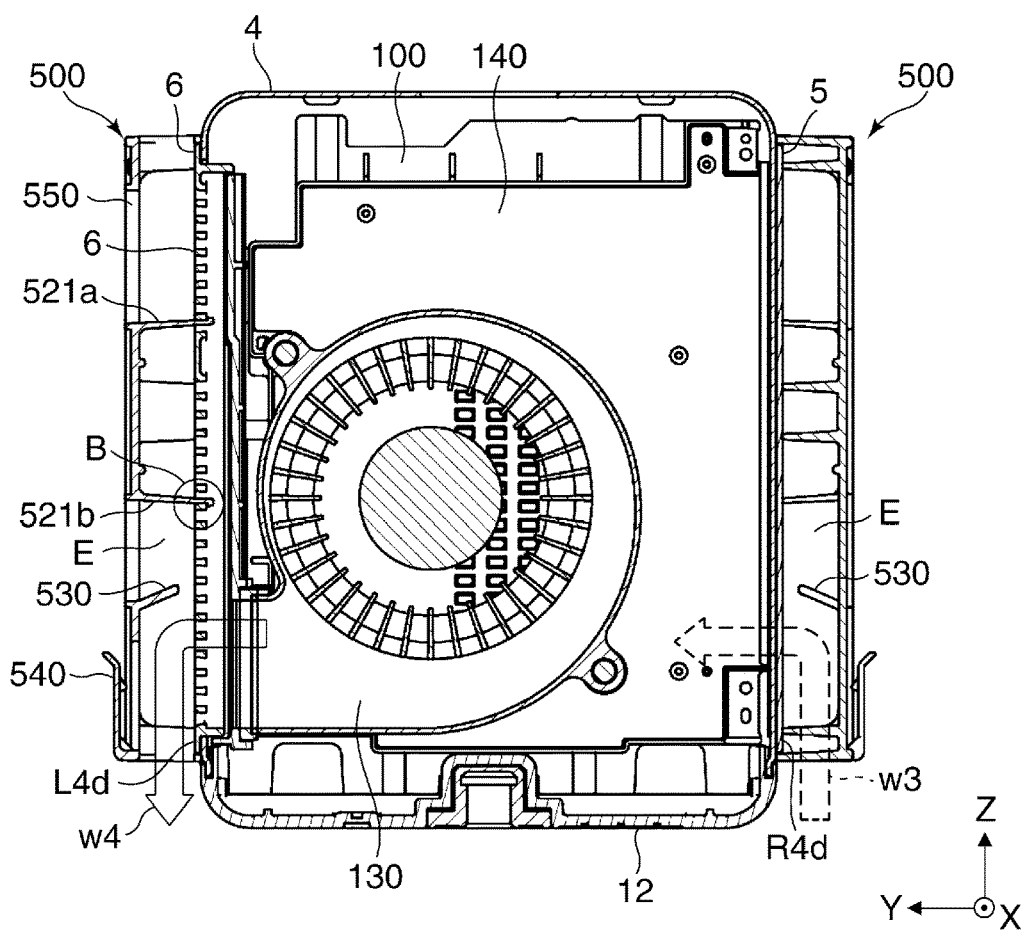
FIG. 16 is a view of the image pickup apparatus in a state in which the accessory is mounted, as viewed from the front.
Figure 17:
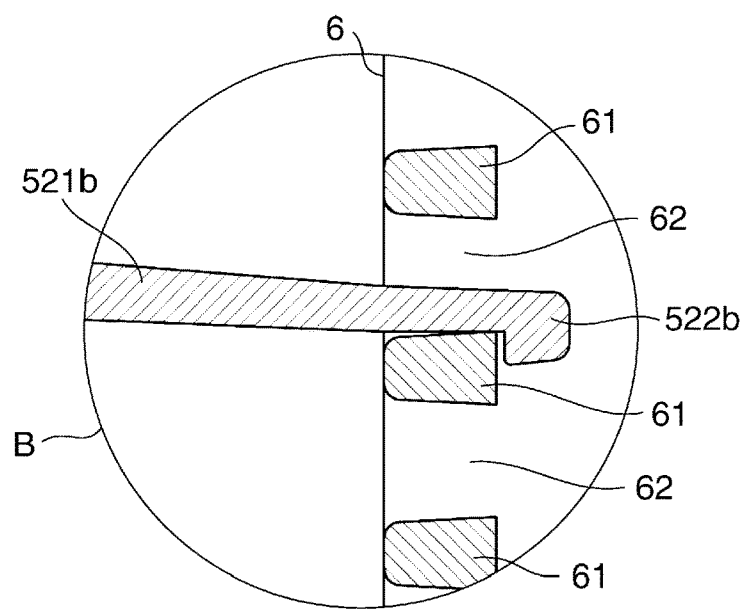
FIG. 17 is a detailed view of B part in FIG. 16.

Next, a description will be given of how to attach the accessory 500 to the image pickup apparatus 1 and the function of the accessory 500 after being attached, with reference to FIGS. 16 to 19. FIG. 16 is a view, partly in cross-section, of the image pickup apparatus 1 in a state in which the accessories 500 are attached, as viewed from the front. FIG. 17 is a detailed view of B part in FIG. 16. The two accessories 500 having the same construction are prepared, and can be attached to the left side and the right side of the image pickup apparatus 1. The orientation of the accessory 500 in the vertical direction to be set when being attached is predetermined, and further, the accessory 500 is attached such that the tip ends of the extended portions 510 face the image pickup apparatus 1.

As shown in FIG. 16, one accessory 500 is removably attached to each of the intake-side duct cover 5 and the exhaust-side duct cover 6. Here, the description is given mainly of the accessory 500 attached to the exhaust-side duct cover 6. Note that the method of attaching the accessory 500 to the intake-side duct cover 5 and the function of the accessory 500 are the same, and hence part of the description is omitted. When attaching the accessory 500 to the image pickup apparatus 1, a user positions the accessory 500 such that the respective tip ends of the extended portions 510 are fitted to the outer shape of the exhaust-side duct cover 6, and then holds the elastic pieces 521a and 521b. In doing this, the user can operate the elastic pieces 521a and 521b by inserting his/her fingers through the gripping openings H5a and H5b, to thereby elastically deform the elastic pieces 521a and 521 in a direction closer to each other.

Incidentally, the intake-side duct cover 5 and the exhaust-side duct cover 6 each include a plurality of ribs formed along the optical axis direction, and a slit is formed between each adjacent ribs. A plurality of slits thus formed each form a vent hole. For example, as shown in FIG. 17, the exhaust-side duct cover 6 includes the ribs, denoted by reference numeral 61, and the slits, denoted by reference numeral 62, and the slits 62 form the vent holes on the exhaust side (outside exhaust port 60: see FIG. 1B). Although the intake-side duct cover 5 is not shown, the plurality of slits form the vent holes on the intake side (first and second outside air intake ports 51 and 52: see FIG. 1A).

As shown in FIG. 17, the user inserts the latching lugs 522a and 522b in the corresponding slits 62 of the exhaust-side duct cover 6, respectively, and causes the latching lugs 522a and 522b to be engaged with the ribs 61 which are at the respective corresponding positions. Although only the latching lug 522b is illustrated in FIG. 17, the latching lug 522a at an upward location is similarly engaged. Thus, the latching lugs 522a and 522b are engaged with the respective associated ribs 61 at the two locations in the vertical direction, whereby the accessory 500 is held by the exhaust-side duct cover 6, and is attached to the image pickup apparatus 1. Since the user can insert his/her fingers through the gripping openings H5a and H5b, respectively, it is easy for the user to operate the accessory 500 by holding the elastic pieces 521a and 521b, and hence the high operability in attaching the accessory 500 can be ensured. To remove the accessory 500, it is only required to release the engaged state between the latching lugs 522a and 522b and the ribs 61. The accessories 500 can be easily attached and removed to and from the intake-side and exhaust-side duct covers, and hence by removing the accessories 500 when the rain cover 600 is not used, it is possible to prevent the whole apparatus from being increased in size.

In the state in which the accessories 500 are attached to the intake-side and exhaust-side duct covers 5 and 6, respectively, the base portion 550 of each accessory 500 is substantially parallel to the associated duct cover, and is opposed to the associated vent holes. Further, the base portion 550 of each accessory 500 is positioned by the extended portions 510 at a location away from the apparatus body and the vent holes. That is, the extended portions 510 are brought into abutment with the exhaust-side duct cover 6, so that a space E is formed between the base portion 550 and the exhaust-side duct cover 6 (see FIG. 16). Similarly, the space E is also formed between the intake-side duct cover 5 and the base portion 550. Further, an opening L4d is formed between the extended portions 510c and d510f, and the exhaust-side duct cover 6 on the exhaust side. On the intake side, an opening R4d is formed between the extended portions 510c and d510f, and the intake-side duct cover 5. The openings L4d and R4d each open in a substantially downward direction of the electronic apparatus. The openings L4d and R4d are each communicated with an associated one of the spaces E. Therefore, by bringing the extended portions 510 into abutment with the image pickup apparatus 1 in the state in which the accessories 500 are attached, the spaces E are secured between the base portions 550 and the associated vent holes. Further, the openings L4d and R4d which are connected to (communicated with) the spaces E are formed between the extended portions 510c and 510f, the base portions 550, and the image pickup apparatus 1 (particularly, the duct covers). In short, the extended portions 510 are in abutment with the image pickup apparatus 1 on the intake side and the exhaust side, whereby the openings (L4d and R4d) for communicating the vent holes to outside air are formed between image pickup apparatus 1 and the base portions 550.

Next, a description will be given of the intake and exhaust passages formed in a state in which the rain cover is attached. Intake air w3 and exhaust air w4, appearing in FIG. 16, schematically indicate the flow of intake air and the flow of exhaust air, respectively, which are generated by driving the fan 130 in the state in which the rain cover is attached. Each louver 530 regulates the flow of air so as to form an air flow passage between the associated vent holes and the openings (L4d and R4d). The intake air w3 is sucked from the opening R4d, advances in substantially parallel to the intake-side duct cover 5 to flow through the space E, and then enters the inside from vent holes (the first outside air intake port 51 and the second outside air intake port 52) of the intake-side duct cover 5. On the other hand, the exhaust air w4 flows out from the exhaust-side duct cover 6 in a direction substantially perpendicular thereto into the space E, and thereafter has its advancing direction regulated to the negative z-axis direction by the action of the louver 530, and then flows out from the opening L4d into outside air.

Figure 18A:
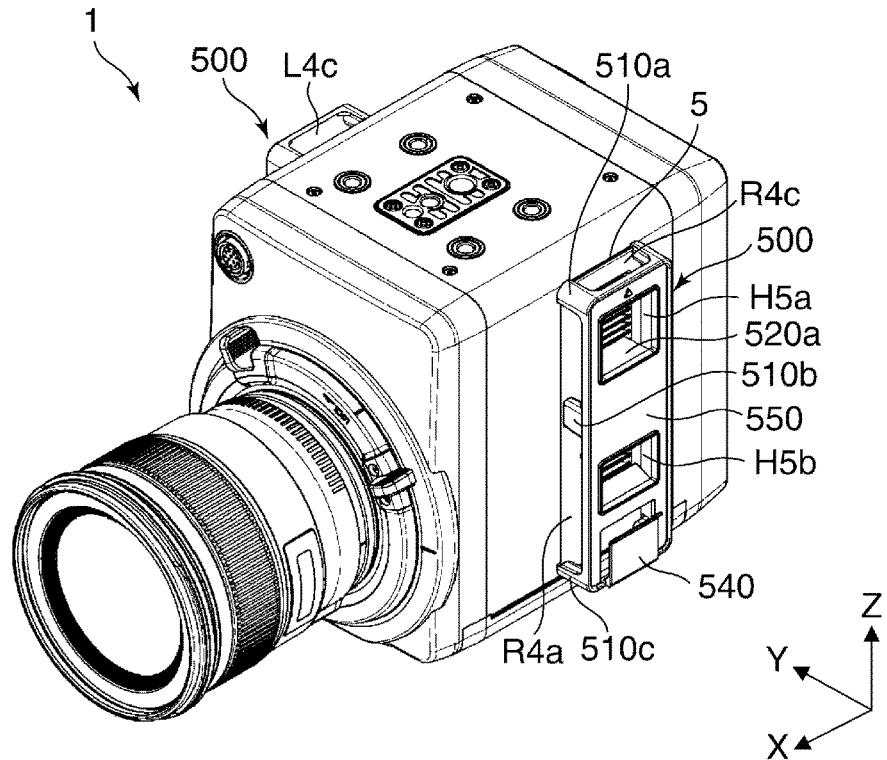
FIG. 18A is a perspective view of the image pickup apparatus system including the image pickup apparatus in the state in which the accessory is mounted, as viewed from above.
Figure 18B:
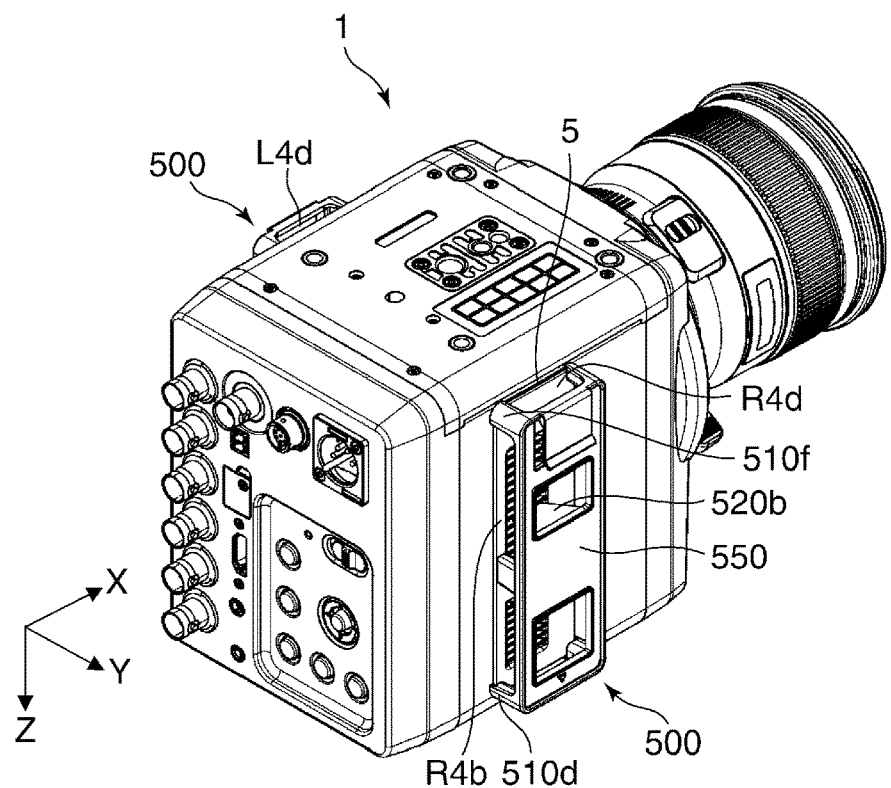
FIG. 18B is a perspective view of the image pickup apparatus system including the image pickup apparatus in the state in which the accessory is mounted, as viewed from below.

FIGS. 18A and 18B are perspective views of the image pickup apparatus system including the image pickup apparatus 1 in the state in which the accessories 500 are attached, as viewed from above and below, respectively. It is assumed that one accessory 500 is attached to each of the intake-side duct cover 5 and the exhaust-side duct cover 6. Although in FIGS. 18A, 18B, and 19, the description is given mainly of the accessory 500 attached to the intake-side duct cover 5 in detail, the same is applied to the accessory 500 attached to the exhaust-side duct cover 6, and hence description thereof is omitted.

As described above, when the accessories 500 are attached, the spaces E (see FIG. 16) are formed by the extended portions 510 and the like. Further, the openings R4 (R4a, R4b, R4c, and R4d) are formed in four surfaces extending in the front-rear direction and the vertical direction, which are defined by the intake-side duct cover 5, the extended portions 510, and the base portions 550, and are perpendicular to the intake-side duct cover 5 (also see FIG. 16 with respect to the opening R4d). Further, similarly, openings L4 are formed in four surfaces extending in the front-rear direction and the vertical direction, which are defined by the exhaust-side duct cover 6, the extended portions 510, and the base portions 550, and are perpendicular to the exhaust-side duct cover 6. FIGS. 18A and 18B show only the openings L4c and L4d as for the openings L4 (see FIG. 16 as well as for the opening L4d). By forming these openings, it is possible to prevent the first outside air intake port 51, the second outside air intake port 52, and the outside exhaust port 60 (see FIGS. 1A and 1B) from being blocked by attaching the rain cover 600, and prevent lowering of the amount of air flow. The total area of the plurality of openings R4 is equal to or larger than the area obtained by adding the areas of the first outside air intake port 51 and the second outside air intake port 52. Further, the total area of the plurality of openings L4 is equal to or larger than the area of the outside exhaust port 60. This prevents the ventilation resistance from being increased by attaching the accessory 500.

Figure 19:
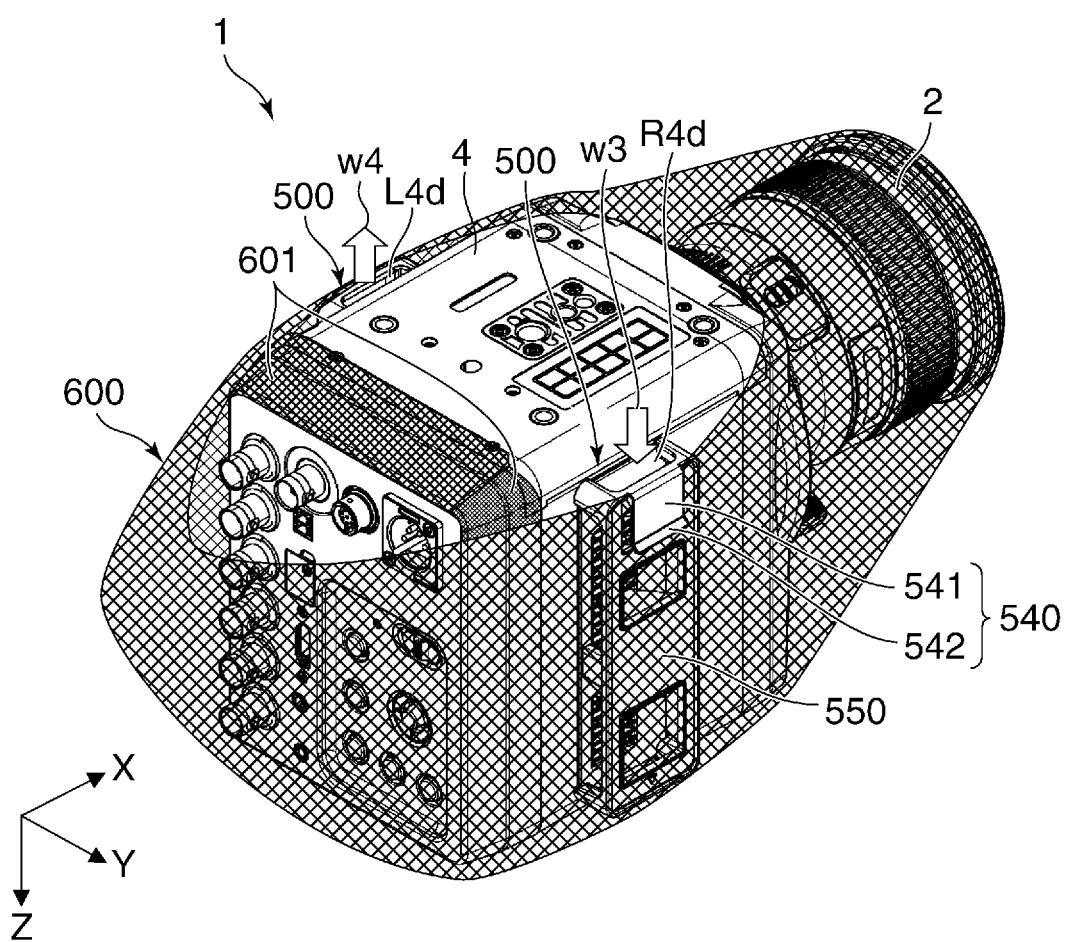
FIG. 19 is a perspective view of the image pickup apparatus system including the image pickup apparatus in a state in which the accessory and a rain cover are mounted, as viewed from below.

FIG. 19 is a perspective view of the image pickup apparatus system including the image pickup apparatus 1 in a state in which the accessories 500 and the rain cover 600 are attached, as viewed from below (from the negative z-axis direction). The user covers the image pickup apparatus 1 with the rain cover 600 as desired. The rain cover 600 covers the outside of the image pickup apparatus 1 except the bottom portion, and prevents rainwater or the like from entering the image pickup apparatus 1 from above (from the positive z-axis direction) or from the side.

Next, a description will be given of how to attach the rain cover 600 to the image pickup apparatus 1. The rain cover 600 is caused to cover the outside of the interchangeable lens 2, and is then caused to cover the image pickup apparatus 1 from above along the exterior of the image pickup apparatus 1 and the base portions 550 of the accessories 500. Opposite end portions of the rain cover 600 are guided to the position between the elastic portions 541 and the base portions 550 by the guide portions 542 formed on the regulating portions 540. Here, each elastic portion 541 is elastically deformed to hold an associated one of the end portions of the rain cover 600. Further, displacement of the rain cover 600 is suppressed by the anti-slip ribs 543 (see FIG. 15A). The user causes the end portions of the rain cover 600 (respective positions in the vicinity of the openings R4d and L4d) to be regulated by the regulating portions 540, and then causes the rain cover 600 to be fixed with a pair of Velcro Tapes® 601.

As described above, the positions of the end portions of the rain cover 600 are regulated by the regulating portions 540, whereby the openings R4d and L4d formed at the bottom of the image pickup apparatus 1 are prevented from being blocked. Although the intake air sucked by driving the fan 130 is introduced from the plurality of openings R4, the opening R4d of them is not covered with the rain cover 600, and hence the ventilation resistance is relatively low. For this reason, a lot of intake air (intake air w3) is sucked from the openings R4. On the other hand, although air is discharged from the openings L4, the opening L4d of them is not covered with the rain cover 600, and hence the ventilation resistance is relatively low. Further, the main flow passage from the outside exhaust port 60 to the opening L4d is easily formed by the action of the louver 530. Therefore, a lot of exhaust air (exhaust air w4) is discharged from the opening L4d into outside air.

Thus, it is possible to prevent the exhaust heat from remaining in minute spaces between the rain cover 600 and the image pickup apparatus 1. With this, the exhaust heat is prevented from being transferred around to the intake side, which makes it possible to clearly separate the intake passage and the exhaust passage. As a result, in the state in which the rain cover 600 is attached, it is possible to form an effective heat dissipation passage for drawing low-temperature outside air mainly from the opening R4d into the first unit 1001, and after causing the air to deprive heat from the image pickup apparatus 1, discharging the air mainly from the opening L4d into outside air for heat dissipation.

According to the present embodiment, in the state in which the accessories 500 are attached to the image pickup apparatus 1, the spaces E are formed by the extended portions 510, and also, the openings L4d and R4d communicated with the spaces E are formed. The openings L4d and R4d connect between the vent holes (the outside exhaust port 60, and the first and second outside air intake ports 51 and 52) and outside air. By attaching the accessories 500, even when the image pickup apparatus 1 is covered with the rain cover 600, the positions of the end portions of the rain cover 600 are regulated by the regulating portions 540, whereby the openings L4d and R4d are prevented from being blocked. This makes it possible to improve the heat dissipation efficiency of the image pickup apparatus 1. Particularly, even when the image pickup apparatus 1 is covered with the rain cover 600, it is possible to ensure the ventilation performance, and thereby maintain the heat dissipation function.

Further, the flow of air is regulated by the louvers 530 such that air flow passages are formed between the vent holes (the outside exhaust port 60, and the first and second outside air intake ports 51 and 52) and the openings L4d and R4d, respectively. Further, since the total area of the openings R4 is equal to or larger than the total area of the first and second outside air intake ports 51 and 52, and the total area of the openings L4 is equal to or larger than the area of the outside exhaust port 60, even when the accessories 500 are attached, increase in ventilation resistance is suppressed. With this arrangement, it is possible to smoothly suck and discharge air, which contributes to ensuring of the heat dissipation efficiency.

Further, the ribs 61 forming the vent holes form a portion where the accessory 500 is attached, which prevents the number of components from being increased. What is more, the user can operate the attachment pieces 520a and 520b by inserting his/her fingers through the gripping openings H5a and H5b formed in the base portion 550, and attach the accessory 500 by engaging the latching lugs 522a and 522b of the attachment pieces 520a and 520b with the ribs 61. With this arrangement, the user can easily perform the operation for attaching and removing the accessory 500.

Further, there is no need of distinguishing the right and left sides of the accessory 500, and the accessory 500 can be used for both of the intake and exhaust sides, which makes it unnecessary to provide the accessory 500 in an increased number of types.

Note that the accessory 500 of the present embodiment can be applied to the electronic apparatus according to the first, second, and third embodiments, and the type of the electronic apparatus to which the accessory 500 is applied is not limited.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-042948 filed Mar. 7, 2017, and Japanese Patent Application No. 2017-167365 filed Aug. 31, 2017, which are hereby incorporated by reference herein in their entirety.

What is claimed is:

1. An image pickup apparatus comprising:
an image pickup section including an image pickup device;
a circuit board configured to perform image processing on output from the image pickup device;
a duct section configured to discharge heat generated on the circuit board to outside; and
a rear member that is disposed at a rear part of the image pickup apparatus in an optical axis direction, and forms a part of an exterior,
wherein the circuit board is disposed between the duct section and the rear member in the optical axis direction, and
wherein the duct section includes a plurality of extended portions that are extended in the optical axis direction and are fixed to the rear member.

2. The image pickup apparatus according to claim 1, wherein the duct section has a fan mounted thereon.

3. The image pickup apparatus according to claim 1, wherein the plurality of extended portions are provided to surround the circuit board.

4. The image pickup apparatus according to claim 3, wherein the circuit board is formed with relief portions for avoiding interference with the plurality of extended portions.

5. The image pickup apparatus according to claim 1, further comprising a bottom member that forms a part of the exterior, and
wherein the duct section is fixed to the bottom member.

6. The image pickup apparatus according to claim 5, wherein the bottom member is made of a metallic material.

7. The image pickup apparatus according to claim 1, further comprising a top member that forms a part of the exterior, and
wherein the duct section is fixed to the top member.

8. The image pickup apparatus according to claim 7, wherein the top member is made of a metallic material.

9. The image pickup apparatus according to claim 1, wherein the rear member is made of a metallic material.

10. An electronic apparatus comprising:
a fan that has an intake port;
a duct section that has an opening corresponding to the intake port of the fan;
a circuit board that is connected to the duct section, and is disposed to be laminated on the duct section on an opposite side from the fan;
a first cover that is disposed on an opposite side of the circuit board from the fan, and forms a part of an exterior; and
a second cover that forms a part of the exterior in a direction substantially orthogonal to a laminating direction in which the duct section and the circuit board are laminated,
wherein the duct section includes a plurality of first extended portions extended to surround the circuit board, and a plurality of second extended portions extended in the direction substantially orthogonal to the laminating direction,
wherein the first extended portions are fixed to the first cover, and the second extended portions are fixed to the second cover, and
wherein the first cover includes a rear cover and the second cover includes at least one of a bottom cover or a top cover.

11. The electronic apparatus according to claim 10, wherein the second cover is disposed on a bottom side of the electronic apparatus.

12. The electronic apparatus according to claim 11, further comprising a third cover that has a substantially U-shape, and covers the duct section from above and sides, and
wherein the third cover is disposed to sandwich the duct section in a left-right direction.

13. The electronic apparatus according to claim 10, wherein the second cover is arranged on a top side of the electronic apparatus.

14. The electronic apparatus according to claim 10, wherein the first cover is made of a metallic material.

15. The electronic apparatus according to claim 10, wherein the circuit board is formed with relief portions for avoiding interference with the first extended portions.

16. The electronic apparatus according to claim 10,
wherein the duct section includes a first heat dissipation section and a second heat dissipation section, on each of which fins substantially parallel to a main flow direction are disposed, and an opening corresponding to the intake port of the fan,
wherein the first heat dissipation section is larger in flow passage length than the second heat dissipation section,
wherein out of the fins disposed on the first and second heat dissipation sections, at least the fins dispose on the first heat dissipation section are each divided into a plurality of divided fins with respect to the main flow direction, and
wherein the number of fins per unit length in the main flow direction is larger in the first heat dissipation section than in the second heat dissipation section.

17. The electronic apparatus according to claim 16,
wherein the fins disposed on the first heat dissipation section and the fins disposed on the second heat dissipation section are disposed in plurality and in parallel, respectively, and
wherein a pitch of the fins disposed on the second heat dissipation section is larger than a pitch of the fins disposed on the first heat dissipation section.

18. The electronic apparatus according to claim 16,
wherein the fins disposed on the second heat dissipation section are disposed in plurality and in parallel, and
wherein a pitch of the fins disposed on the second heat dissipation section is smaller as a distance from a center of the opening is smaller.

19. The electronic apparatus according to claim 16, wherein an area of an intake opening of the duct section, associated with the first heat dissipation section, is larger than an area of an intake opening associated with the second heat dissipation section.

20. The electronic apparatus according to claim 16, wherein an air flow passage in the first heat dissipation section forms a substantially linear shape.

21. The electronic apparatus according to claim 20, wherein an air flow passage in the second heat dissipation section forms a substantially bent shape.

22. The electronic apparatus according to claim 16, wherein out of the fins disposed on the first heat dissipation section, a fin closest to the intake opening of the duct section, associated with the first heat dissipation section, is larger in length than a fin adjacent to the fin in the main flow direction.

23. The electronic apparatus according to claim 16,
wherein the fins disposed in the second heat dissipation section is divided into a plurality of divided fins with respect to the main flow direction, and
wherein out of the fins disposed on the second heat dissipation section, a fin closest to an intake opening of the duct section, associated with the second heat dissipation section, is larger in length than a fin adjacent to the fin in the main flow direction.

24. The electronic apparatus according to claim 16, wherein the opening and the fan are provided as a single opening and a single fan.

25. The electronic apparatus according to claim 16, wherein some of the plurality of divided fins in the first heat dissipation section exist in a part of an area opposed to the opening.

26. The electronic apparatus according to claim 25, wherein out of the fins dispose on the first heat dissipation section, the divided fins which exist in the part of the area opposed to the opening are lower in protrusion height than divided fins which exist in an area which is not opposed to the opening.

27. The electronic apparatus according to claim 10, wherein the fan is a centrifugal fan.

28. An image pickup apparatus including an electronic apparatus, the electronic apparatus comprising:
a fan that has an intake port;
a duct section that has an opening corresponding to the intake port of the fan;
a circuit board that is connected to the duct section, and is disposed to be laminated on the duct section on an opposite side from the fan;
a first cover that is disposed on an opposite side of the circuit board from the fan, and forms a part of an exterior; and
a second cover that forms a part of the exterior in a direction substantially orthogonal to a laminating direction in which the duct section and the circuit board are laminated,
wherein the duct section includes a plurality of first extended portions extended to surround the circuit board, and a plurality of second extended portions extended in the direction substantially orthogonal to the laminating direction,
wherein the first extended portions are fixed to the first cover, and the second extended portions are fixed to the second cover, and
wherein the first cover includes a rear cover and the second cover includes at least one of a bottom cover or a top cover.

* * * * *